US010770165B1

(12) United States Patent
Cai et al.

(10) Patent No.: US 10,770,165 B1
(45) Date of Patent: Sep. 8, 2020

(54) NO-VERIFY PROGRAMMING FOLLOWED BY SHORT CIRCUIT TEST IN MEMORY DEVICE

(71) Applicant: SanDisk Technologies LLC, Addison, TX (US)

(72) Inventors: Xue Qing Cai, Fremont, CA (US); Jiahui Yuan, Fremont, CA (US); Deepanshu Dutta, Fremont, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 16/571,844

(22) Filed: Sep. 16, 2019

(51) Int. Cl.
*G11C 29/50* (2006.01)
*G11C 11/4094* (2006.01)
*G11C 11/408* (2006.01)

(52) U.S. Cl.
CPC .......... *G11C 29/50* (2013.01); *G11C 11/4085* (2013.01); *G11C 11/4094* (2013.01); *G11C 2029/5004* (2013.01)

(58) Field of Classification Search
None
See application file for complete search history.

(56) References Cited

U.S. PATENT DOCUMENTS

| 5,181,205 | A  | * | 1/1993  | Kertis ............... G11C 11/417 324/522 |
| 6,574,159 | B2 | * | 6/2003  | Ohbayashi ............ G11C 29/50 365/200 |
| 7,212,454 | B2 |   | 5/2007  | Kleveland et al. |
| 7,924,587 | B2 |   | 4/2011  | Perlmutter et al. |
| 9,330,783 | B1 | * | 5/2016  | Rotbard ............... G11C 29/025 |
| 9,355,735 | B1 |   | 5/2016  | Chen et al. |
| 9,390,809 | B1 |   | 7/2016  | Shur et al. |
| 9,785,493 | B1 |   | 10/2017 | Zhang et al. |
| 2007/0171740 | A1 | * | 7/2007 | Kim ..................... G11C 29/02 365/201 |
| 2016/0267980 | A1 |   | 9/2016  | Akamine et al. |
| 2017/0117036 | A1 |   | 4/2017  | Al-Shamma et al. |

OTHER PUBLICATIONS

U.S. Appl. No. 16/402,151, filed May 2, 2019.
International Search Report & The Written Opinion of the International Searching Authority dated Jul. 9, 2020, International Application No. PCT/US2020/024111.

* cited by examiner

Primary Examiner — Tan T. Nguyen
(74) Attorney, Agent, or Firm — Vierra Magen Marcus LLP

(57) ABSTRACT

Techniques are described for programming memory cells without performing a verify test, where the programming is followed by a short circuit test. In one aspect, an initial programming is performed on memory cells of a first word line of a block using a program pulse with an initial magnitude, Vpgm. By reading the memory cells, Vpgm can be optimized for programming subsequent word lines. The subsequent word lines may be programmed using a no-verify program operation followed by a word line short circuit test, for one or more word lines involved in the program operation. The short circuit test can be performed concurrently on a single word line, multiple word lines and/or one or more sub-blocks of a block, based on an amount of write data which can be storage by a controller.

20 Claims, 15 Drawing Sheets

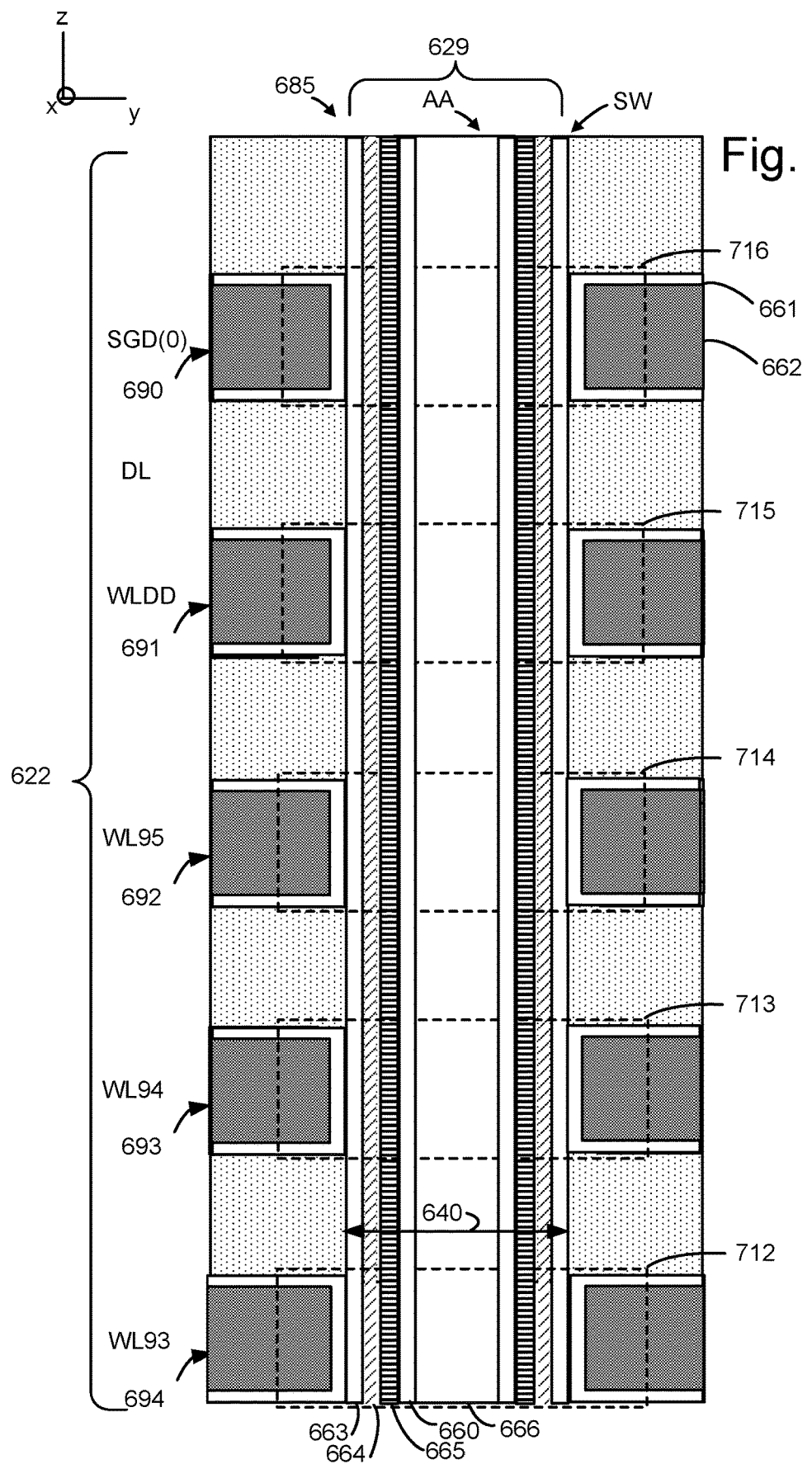

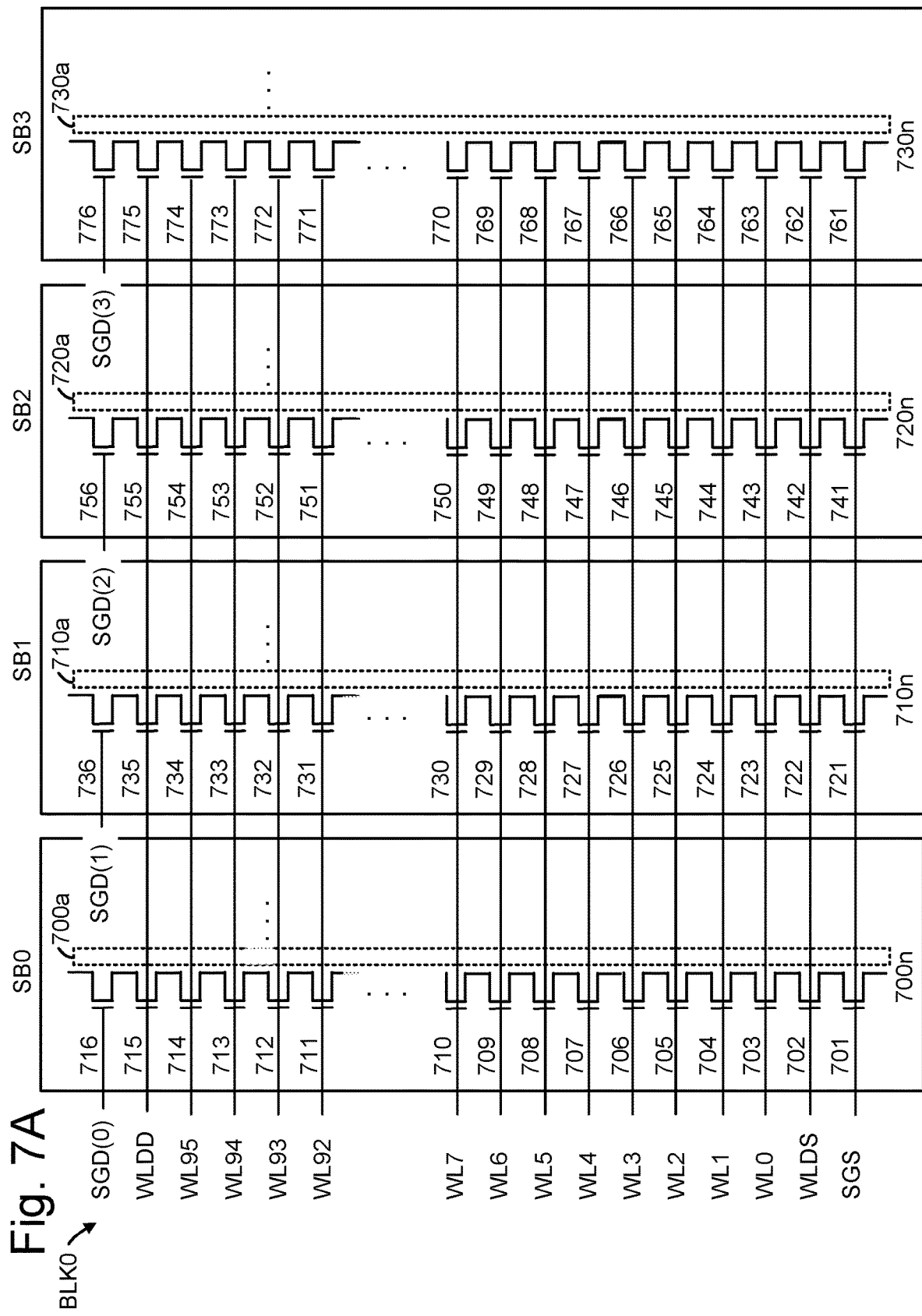

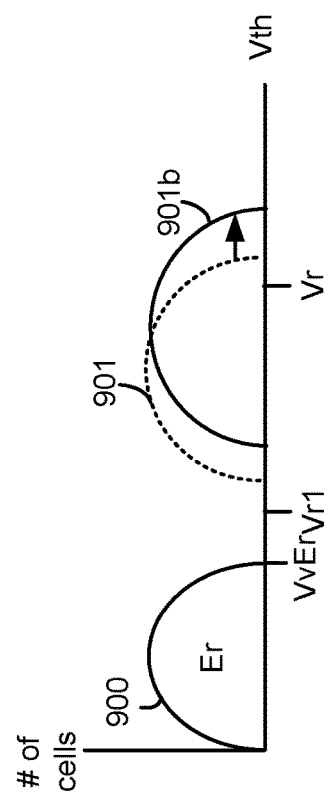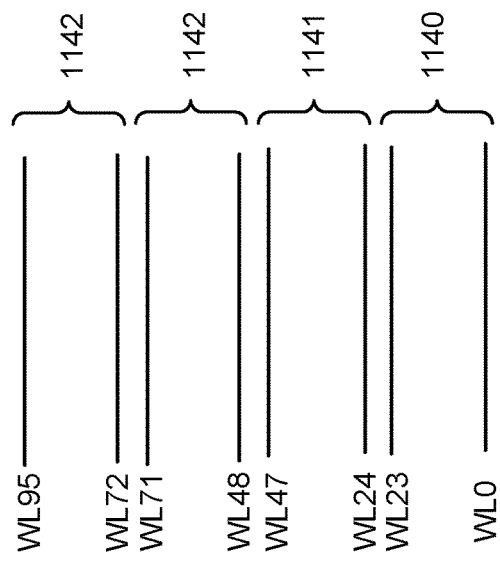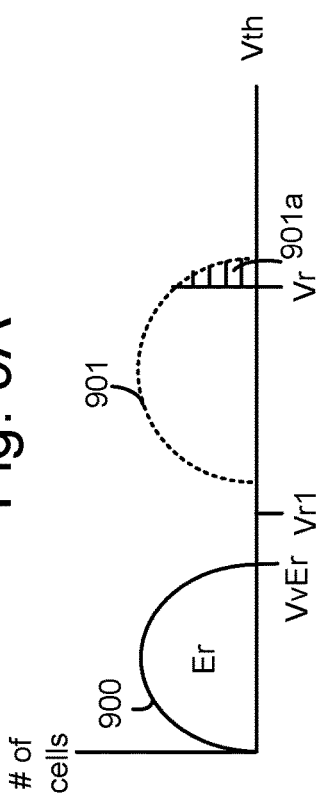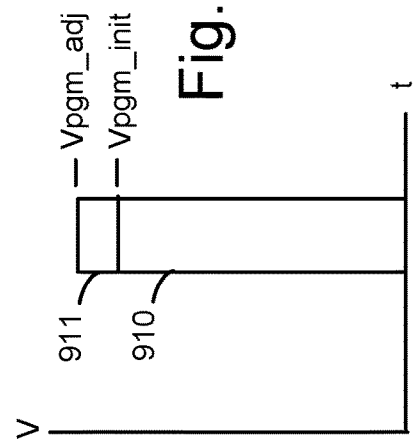

Fig. 12A

|       | SB0 | SB1 | SB2 | SB3 |
|-------|-----|-----|-----|-----|
| SGD   | on  | on  | on  | on  |
| WLDD  | ------------Vread-------------- |||| 
| WL95  | ------------Vread-------------- ||||
| ...   |     |     |     |     |
| WLn+1 | ------------Vread-------------- ||||
| WLn   | ------------Vtest-------------- ||||
| WLn-1 | ------------Vread-------------- ||||
| ...   |     |     |     |     |
| WL0   | ------------Vread-------------- ||||
| WLDS  | ------------Vread-------------- ||||
| SGS   | on  | on  | on  | on  |

Fig. 12B

|       | SB0 | SB1 | SB2 | SB3 |
|-------|-----|-----|-----|-----|
| SGD   | on  | on  | on  | on  |
| WLDD  | ------------Vread-------------- ||||
| WL95  | ------------Vread-------------- ||||
| ...   |     |     |     |     |
| WLn+3 | ------------Vread-------------- ||||
| WLn+2 | ------------Vtest-------------- ||||
| WLn+1 | ------------Vtest-------------- ||||
| WLn   | ------------Vtest-------------- ||||
| WLn-1 | ------------Vread-------------- ||||
| ...   |     |     |     |     |
| WL0   | ------------Vread-------------- ||||
| WLDS  | ------------Vread-------------- ||||
| SGS   | on  | on  | on  | on  |

Fig. 12C

|       | SB0 | SB1 | SB2 | SB3 |
|-------|-----|-----|-----|-----|
| SGD   | on  | on  | on  | on  |
| WLDD  | ------------Vread-------------- ||||
| WL95  | ------------Vread-------------- ||||
| ...   |     |     |     |     |
| WLn+2 | ------------Vread-------------- ||||
| WLn+1 | ------------Vtest-------------- ||||
| WLn   | ------------Vtest-------------- ||||
| WLn-1 | ------------Vread-------------- ||||
| ...   |     |     |     |     |
| WL0   | ------------Vread-------------- ||||
| WLDS  | ------------Vread-------------- ||||
| SGS   | on  | on  | on  | on  |

Fig. 12D

|       | SB0 | SB1 | SB2 | SB3 |
|-------|-----|-----|-----|-----|
| SGD   | on  | on  | on  | off |
| WLDD  | ------------Vread-------------- ||||
| WL95  | ------------Vread-------------- ||||
| ...   |     |     |     |     |
| WLn+2 | ------------Vread-------------- ||||
| WLn+1 | ------------Vread-------------- ||||
| WLn   | ------------Vtest-------------- ||||
| WLn-1 | ------------Vread-------------- ||||
| ...   |     |     |     |     |
| WL0   | ------------Vread-------------- ||||
| WLDS  | ------------Vread-------------- ||||
| SGS   | on  | on  | on  | off |

Fig. 12E

|       | SB0 | SB1 | SB2 | SB3 |
|-------|-----|-----|-----|-----|
| SGD   | on  | on  | off | on  |
| WLDD  | ------------Vread-------------- ||||
| WL95  | ------------Vread-------------- ||||
| ...   |     |     |     |     |
| WLn+2 | ------------Vread-------------- ||||
| WLn+1 | ------------Vtest-------------- ||||
| WLn   | ------------Vtest-------------- ||||
| WLn-1 | ------------Vread-------------- ||||
| ...   |     |     |     |     |
| WL0   | ------------Vread-------------- ||||
| WLDS  | ------------Vread-------------- ||||
| SGS   | on  | on  | off | on  |

NO-VERIFY PROGRAMMING FOLLOWED BY SHORT CIRCUIT TEST IN MEMORY DEVICE

BACKGROUND

The present technology relates to the operation of storage and memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in series, in NAND strings (e.g., NAND chains), for instance, where select gate transistors are provided at the ends of a NAND string to selectively connect a channel of the NAND string to a source line or bit line. However, various challenges are presented in operating such memory devices.

BRIEF DESCRIPTION OF THE DRAWINGS

FIG. 6B depicts a close-up view of the region 622 of the stack of FIG. 6A.

FIG. 7A depicts an example view of NAND strings in a block BLK0 which is consistent with FIGS. 4 and 6A.

FIG. 9A depicts example Vth distributions of a set of memory cells storing one bit per cell, and evaluation of an upper tail of the Vth distribution.

FIG. 9B depicts example program pulses 910 and 911 used in a program operation.

FIG. 9C depicts an example of the table 116 of FIG. 1, showing an adjustment ΔVpgm to the program pulse 910 of FIG. 9B as a function of a count of memory cells having a Vth>Vr, consistent with FIG. 9A.

FIG. 9D depicts example groups of memory cells which can each have an optimized program pulse magnitude, consistent with FIGS. 9A and 9C.

FIG. 9E depicts an example Vth distribution 901b which is obtained by programming memory cells in the Vth distribution 901 of FIG. 9A with an additional program pulse of magnitude Vpgm_adj, consistent with FIG. 9B.

FIG. 12A depicts example word line and select gate voltages for use in step 1021 of the process of FIG. 10C, where the short circuit test is for one word line WLn and all four sub-blocks SB0-SB3.

FIG. 12B depicts example word line and select gate voltages for use in step 1021 of the process of FIG. 10C, where the short circuit test is for three word lines WLn to WLn+2 and all four sub-blocks SB0-SB3.

FIG. 12C depicts example word line and select gate voltages for use in step 1021 of the process of FIG. 10C, where the short circuit test is for one word line WLn and all four sub-blocks SB0-SB3, and another word line WLn+1 and two of four sub-blocks (SB0 and SB1).

FIG. 12D depicts example word line and select gate voltages for use in step 1021 of the process of FIG. 10C, where the short circuit test is for one word line WLn and three of four sub-blocks SB0-SB2.

FIG. 12E depicts example word line and select gate voltages for use in step 1021 of the process of FIG. 10C, and following the configuration of FIG. 12D, where the short circuit test is for one word line WLn and one of four sub-blocks SB3, and a next word line WLn+1 and two of four sub-blocks SB0 and SB1.

DETAILED DESCRIPTION

Figure 1:
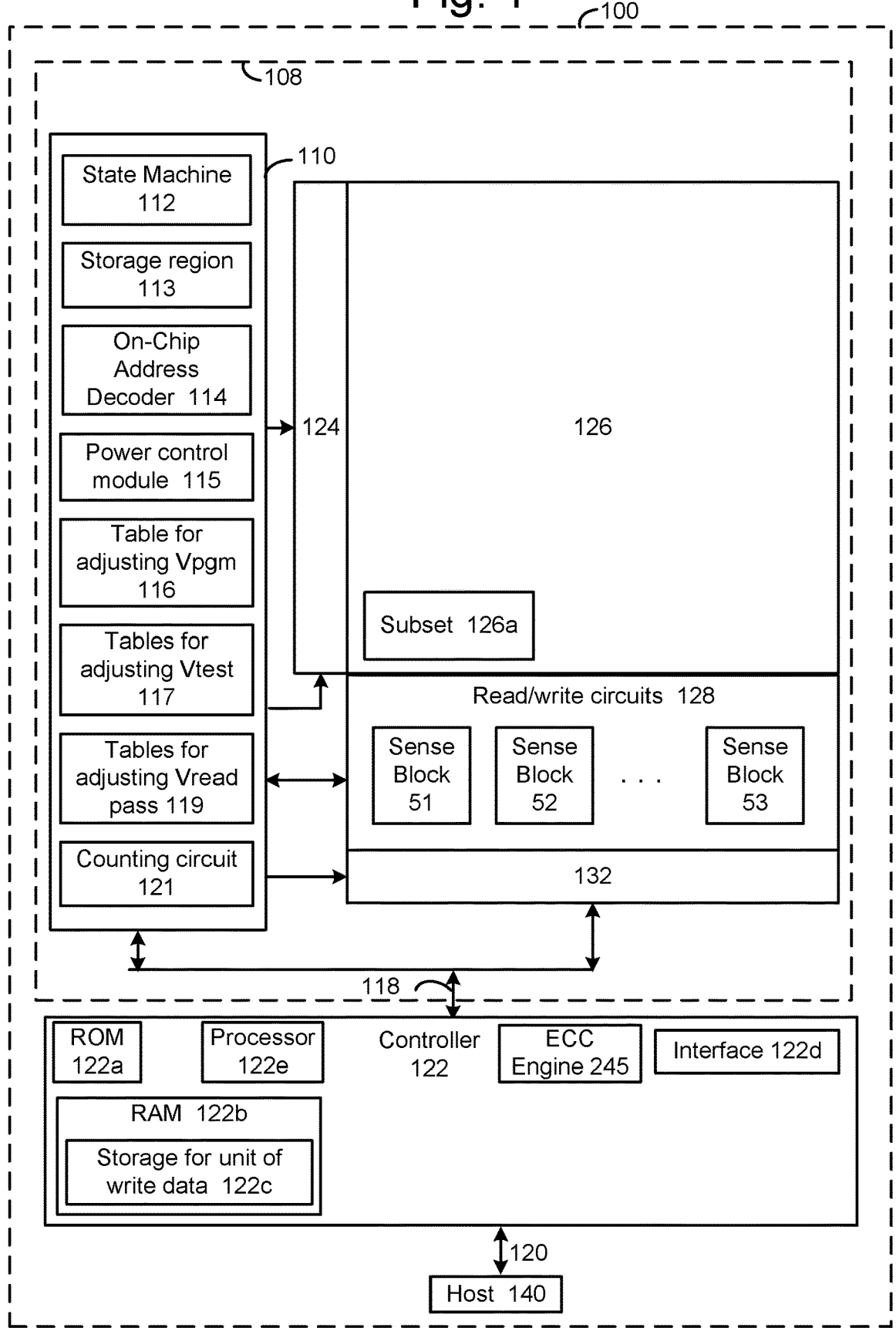
FIG. 1 is a block diagram of an example storage device.

Apparatuses and techniques are described for programming memory cells without performing a verify test, where the programming is followed by a short circuit test.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string or set of connected memory cells, which is connected to a source line. Further, the memory cells can be arranged with a common control gate line (e.g., word line) which acts a control gate. A set of word lines extends from the source-side of a block to the drain-side of a block. Memory cells can be connected in other types of strings and in other ways as well.

In a 3D memory structure, the memory cells may be arranged in vertical NAND strings in a stack, where the stack comprises alternating conductive and dielectric layers. The conductive layers act as word lines which are connected to the memory cells. Each NAND string may have the shape of a pillar which intersects with the word lines to form the memory cells. In a 2D memory structure, the memory cells may be arranged in horizontal NAND strings on a substrate.

After a block of memory cells is erased in an erase operation, programming can occur. During a programming operation, the memory cells are programmed according to a word line programming order and a sub-block programming order. For example, the programming may start at the word line at the source-side of the block, such as WL0 in FIG. 7B. Each sub-block of memory cells is programmed one sub-block at a time. For example, sets of memory cells 800, 801, 802 and 803 in SB0-SB3, respectively, are successively programmed. The programming then proceeds to WL1 and so forth.

The memory cells can be programmed using single level cell (SLC) programming, where each memory cell stores one bit of data, or multi-level cell (MLC) programming, where each memory cell stores two or more bits of data, SLC programming in particular, can provide a high performance, low cost memory device. SLC programming typically involves applying one or more program pulses to a word line and performing a verify test after each program pulse. The verify tests determine whether the Vth of the memory cells has reached a desired level. However, the verify tests consume time and therefore reduce performance One solution is to perform a no-verify program operation, where a single program pulse is applied to a word line and is not followed by a verify test to confirm that the Vth level of the programmed memory cells is appropriate. However, this technique does not provide confidence that the Vth of the memory cells has reached a desired level due to variations in performance caused by factors such as the number of program-erase cycles, the temperature at which the cycles occurred and the delay between the cycles, and block-to-block program speed variations. Moreover, the potential for word line short circuits which can be created on the programmed word lines is not addressed.

Techniques provided herein address the above and other issues. In one approach, an initial programming of a block is performed on memory cells of a first word line of the block, e.g., WL0 in FIG. 7A, using a program pulse with an initial magnitude, Vpgm_init (FIG. 9B). An upper tail of the threshold voltage (Vth) of the memory cells is then read using a read voltage Vr to determine a portion of the memory cells with Vth>Vr, such as depicted in FIG. 9A. If the portion is sufficiently small, indicating a significant amount of under-programming, Vpgm_init is increased, such as depicted in FIG. 9C, to provide an optimized, adjusted Vpgm_adj. Moreover, if under-programming is indicated, an additional program pulse with the magnitude Vpgm_adj can be applied to WL0 without performing a verify test to complete the programming of WL0. The subsequent word lines can then be programmed using Vpgm_adj without performing a verify test.

By using Vpgm_adj in the programming of the subsequent word lines, the memory cells will be programmed to the desired Vth level. However, this assumes no defect such as a short circuit is generated in the block. To also account for a scenario in which a defect occurs, a word line short circuit test can be performed. In particular, in the subsequent programming using Vpgm_adj, a no-verify program operation can be performed, followed by a word line short circuit test, for one or more word lines involved in the program operation. The time penalty of the word line short circuit test can be minimized by delaying the test according to an amount of write data which can be stored in a volatile storage, e.g., RAM, of a controller. For example, when the storage stores write data for multiple word lines, the short circuit test can be delayed until the multiple word lines are programmed. Further, the short circuit test can be performed concurrently on the multiple word lines. The time penalty of the short circuit test can also be minimized by sensing currents in multiple sub-blocks concurrently to detect the presence of a short circuit.

If a short circuit is detected, the write data in the volatile storage can be programmed to another block. The data from previously-programmed word lines can also be recovered and programmed to another block.

The techniques can be used separately or combined.

These and other features are discussed further below.

FIG. 1 is a block diagram of an example storage device. The memory device 100, such as a non-volatile storage system, may include one or more memory die 108. The memory die 108, or chip, includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die. Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine, an on-chip address decoder 114, a power control module 115 (power control circuit). A table 116 can be provided for adjusting an initial program voltage, Vpgm_init, responsive to a count obtained by the counting circuit 121, such as discussed in connection with FIGS. 9A-9D and 10A. Tables 117 can be provided for adjusting a test voltage, Vtest, such as discussed in connection with FIGS. 10C, 11B and 11C. A table 119 can be provided for adjusting a read pass voltage, Vread pass, such as discussed further below in connection with FIG. 11A. A counting circuit 121 can be provided for counting a number of memory cells whose Vth exceeds a read voltage Vr, as depicted by the region 901*a* in FIG. 9A. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 115 controls the power and voltages supplied to the word lines, select gate lines, bit lines and source lines during memory operations. It can include drivers for word lines, SGS and SGD transistors and source lines. See also FIG. 3. The sense blocks can include bit line drivers, in one approach The circuits may include hardware, software and/or firmware for performing the processes described herein.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 115, tables 116 and 117, sense blocks 51, 52, . . . , 53, read/write circuits 128, controller 122, and so forth.

The off-chip controller 122 (which in one embodiment is an electrical circuit) may comprise a processor 122*e*, memory such as ROM 122*a* and RAM 122*b* and an error-correction code (ECC) engine 245. The ECC engine can correct a number of read errors. The RAM 122*b* can be a DRAM which includes a storage 122*c* for storing a unit of write data. This data is referred to as non-committed data. The storage 122*c* is a volatile storage device associated with the controller 122. A unit of write data refers to an amount of data stored in the volatile storage and transferred to the latches 194-197 in FIG. 2 in one or more program operations. The volatile storage has a capacity to store one unit of write data. The unit of write data can comprise one or more pages of data. A single program operation typically programs one page of data into the memory cells connected to a selected word line. The memory cells which are programmed by one page of data can be all memory cells connected to the selected word line, e.g., in all sub-blocks of a block, or memory cells connected to the selected word line in one or more sub-blocks, but fewer than all sub-blocks of a block. See also FIG. 12A-12E.

During programming, a copy of the data to be programmed is stored in the storage 122*c* until the programming is completed and a short circuit test indicates there is no short circuit in the word lines involved in the programming of the unit of write data. In response to the successful completion, the data is erased from the storage and is committed or released to the block of memory cells.

A memory interface 122*d* may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122*d*.

The memory in the controller 122, such as such as ROM 122*a* and RAM 122*b*, comprises code such as a set of instructions, and the processor is operable to execute the set of instructions to provide the functionality described herein. Alternatively or additionally, the processor can access code from a subset 126*a* of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122*e* fetches the boot code from the ROM 122*a* or the subset 126*a* for execution, and the boot code initializes the system components and loads the control code into the RAM 122*b*. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable m devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory (DRAM) or static random access memory (SRAM) devices, non-volatile memory devices, such as resistive random access memory (ReRAM), electrically erasable programmable read-only memory (EEPROM), flash memory (which can also be considered a subset of EEPROM), ferroelectric random access memory (FRAM), and magnetoresistive random access memory (MRAM), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and SG transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
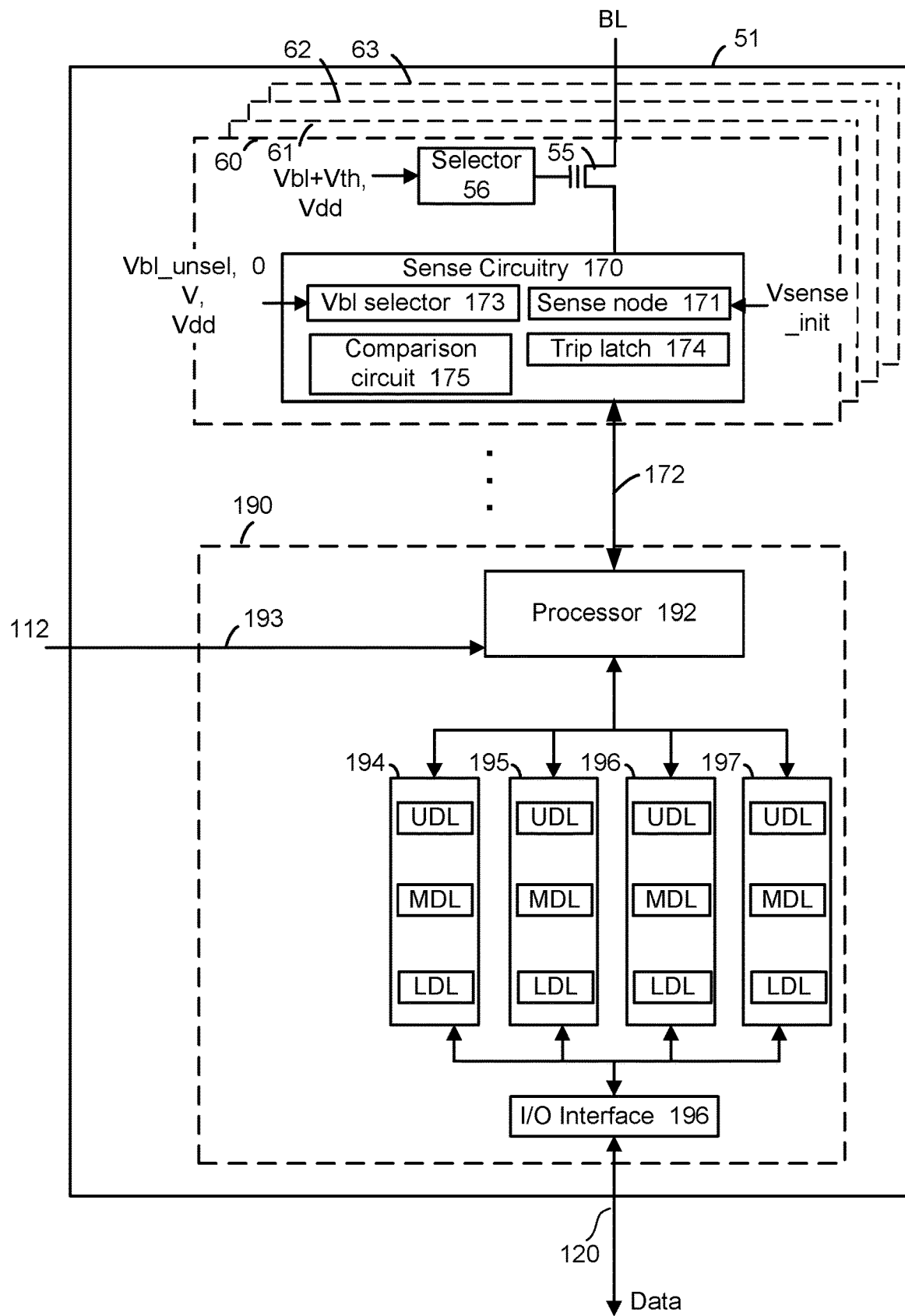
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense circuits 60-63 or sense amplifiers, and a common portion, referred to as a managing circuit 190. In one embodiment, there will be a separate sense circuit for each bit line/NAND string and one common managing circuit 190 for a set of multiple, e.g., four or eight, sense circuits. Each of the sense circuits in a group communicates with the associated managing circuit via data bus 172. Thus, there are one or more managing circuits which communicate with the sense circuits of a set of storage elements (memory cells).

The sense circuit 60, as an example, comprises sense circuitry 170 that performs sensing by determining whether a conduction current in a connected bit line is above or below a predetermined threshold level. The sensing can occur in a read or verify operation. The sense circuit also supplies a bit line voltage during the application of a program voltage in a program operation.

The sense circuitry may include a Vbl selector 173, a sense node 171, a comparison circuit 175 and a trip latch 174. During the application of a program voltage, the Vbl selector 173 can pass Vbl_unsel (e.g., 2 V) to a bit line connected to a memory cell which is inhibited from programmed, or 0 V to a bit line connected to a memory cell which is being programmed in the current program loop. A transistor 55 (e.g., an nMOS) can be configured as a pass gate to pass Vbl from the Vbl selector 173, by setting the control gate voltage of the transistor sufficiently high, e.g., higher than the Vbl passed from the Vbl selector. For example, a selector 56 may pass a power supply voltage Vdd, e.g., 3-4 V to the control gate of the transistor 55.

During sensing operations such as read and verify operations, the bit line voltage is set by the transistor 55 based on the voltage passed by the selector 56. The bit line voltage is roughly equal to the control gate voltage of the transistor minus its Vth (e.g., 1 V). For example, if Vbl+Vth is passed by the selector 56, the bit line voltage will be Vbl. This assumes the source line is at 0 V. The transistor 55 clamps the bit line voltage according to the control gate voltage and acts a source-follower rather than a pass gate. The Vbl selector 173 may pass a relatively high voltage such as Vdd which is higher than the control gate voltage on the transistor 55 to provide the source-follower mode. During sensing, the transistor 55 thus charges up the bit line.

In one approach, the selector 56 of each sense circuit can be controlled separately from the selectors of other sense circuits, to pass Vbl or Vdd. The Vbl selector 173 of each sense circuit can also be controlled separately from the Vbl selectors of other sense circuits During sensing, the sense node 171 is charged up to an initial voltage such as 3 V. The sense node is then connected to the bit line via the transistor 55, and an amount of decay of the sense node is used to determine whether a memory cell is in a conductive or non-conductive state. The comparison circuit 175 is used to compare the sense node voltage to a trip voltage at a sense time. If the sense node voltage decays below the trip voltage Vtrip, the memory cell is in a conductive state and its Vth is at or below the voltage of the verification signal. If the sense node voltage does not decay below Vtrip, the memory cell is in a non-conductive state and its Vth is above the voltage of the verification signal. The sense circuit 60 includes a trip latch 174 that is set by the comparison circuit 175 based on whether the memory cell is in a conductive or non-conductive state. The data in the trip latch can be a bit which is read out by the processor 192.

The managing circuit 190 comprises a processor 192, four example sets of data latches 194-197 and an I/O Interface 196 coupled between the set of data latches 194 and data bus 120. One set of three data latches, e.g., comprising individual latches LDL, MDL and UDL, can be provided for each sense circuit. In some cases, a different number of data latches may be used. In a three bit per cell MLC embodiment, LDL stores a bit for a lower page of data, MDL stores a bit for a middle page of data and UDL stores a bit for an upper page of data. For SLC programming, one of the latches LDL, MDL or UDL is sufficient to store one bit which indicates whether the associated memory cell is to remain in the erased state or is to be programmed to the programmed state.

The processor 192 performs computations, such as to determine the data stored in the sensed memory cell and store the determined data in the set of data latches. Each set of data latches 194-197 is used to store data bits determined by processor 192 during a read operation, and to store data bits imported from the data bus 120 during a program operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed memory cell. As it steps through one or more various predefined control gate voltages corresponding to the various memory states supported by the memory, the sense circuit may trip at one of these voltages and a corresponding output will be provided from sense circuit to processor 192 via the data bus 172. At that point, processor 192 determines the resultant memory state by consideration of the tripping event(s) of the sense circuit and the information about the applied control gate voltage from the state machine via input lines 193. It then computes a binary encoding for the memory state and stores the resultant data bits into data latches 194-197.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during a program verify test of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense circuits, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations for memory cells, the data to be programmed (write data) is stored in the set of data latches 194-197 from the data bus 120.

The program operation, under the control of the state machine, applies a series of programming voltage pulses to the control gates of the addressed memory cells. Each voltage pulse may be stepped up in magnitude from a previous program pulse by a step size in a processed referred to as incremental step pulse programming Each program voltage is followed by a verify operation to determine if the memory cells has been programmed to the desired memory state. In some cases, processor 192 monitors the read back memory state relative to the desired memory state. When the two are in agreement, the processor 192 sets the bit line in a program inhibit mode such as by updating its latches. This inhibits the memory cell coupled to the bit line from further programming even if additional program pulses are applied to its control gate.

Each set of data latches 194-197 may be implemented as a stack of data latches for each sense circuit. In one embodiment, there are three data latches per sense circuit 60. In some implementations, the data latches are implemented as a shift register so that the parallel data stored therein is converted to serial data for data bus 120, and vice versa. All the data latches corresponding to the read/write block of memory cells can be linked together to form a block shift register so that a block of data can be input or output by serial transfer. In particular, the bank of read/write circuits is adapted so that each of its set of data latches will shift data in to or out of the data bus in sequence as if they are part of a shift register for the entire read/write block.

The data latches identify when an associated memory cell has reached certain mileposts in a program operations. For example, latches may identify that a memory cell's Vth is below a particular verify voltage. The data latches indicate whether a memory cell currently stores one or more bits from a page of data. For example, the LDL latches can be used to store a lower page of data. An LDL latch is flipped (e.g., from 0 to 1) when a lower page bit is stored in an associated memory cell. For three bits per cell, an MDL or UDL latch is flipped when a middle or upper page bit, respectively, is stored in an associated memory cell. This occurs when an associated memory cell completes programming.

Figure 3:
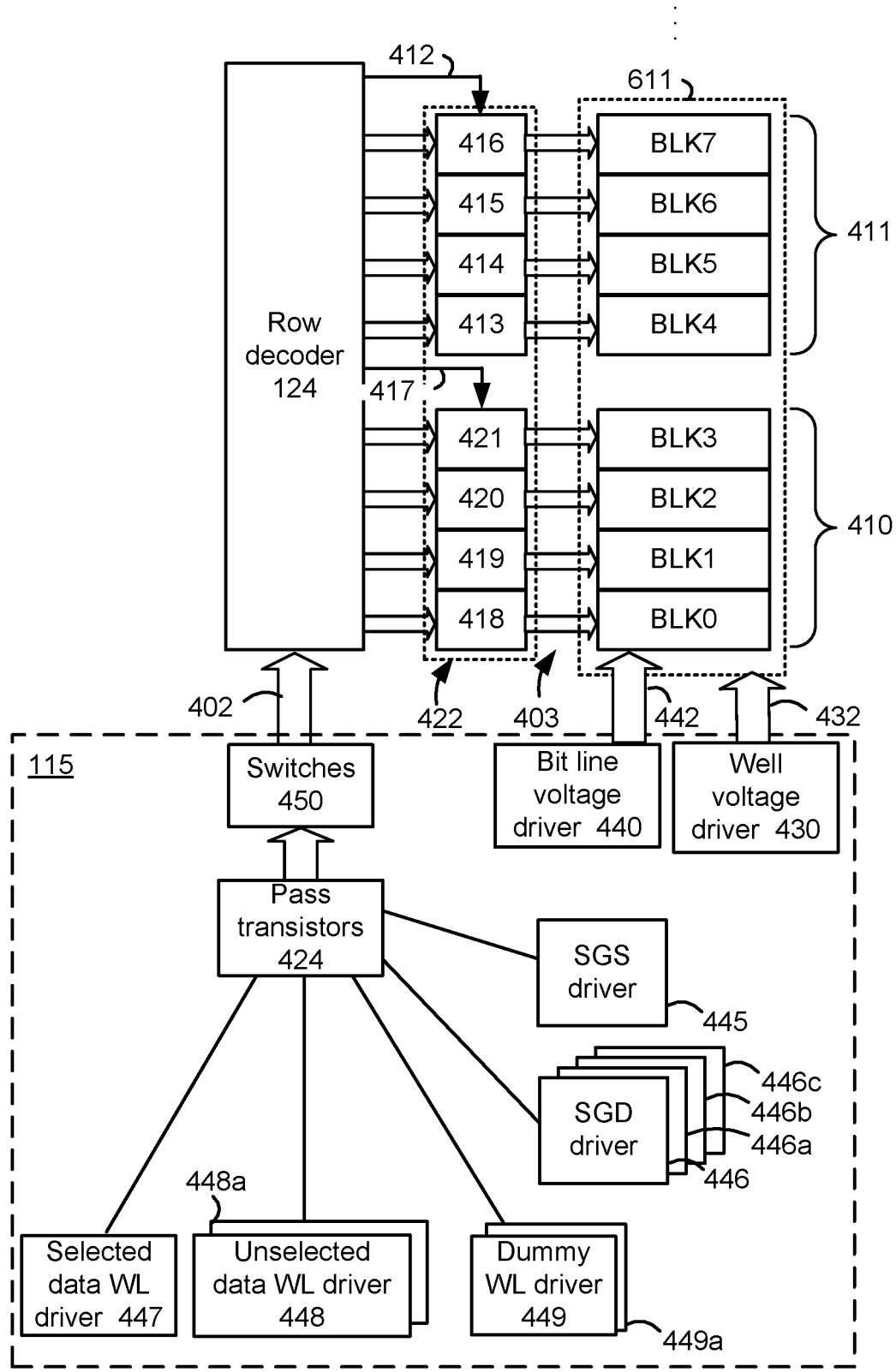
FIG. 3 depicts an example implementation of the power control module 115 of FIG. 1 for providing voltages to blocks of memory cells.

FIG. 3 depicts an example implementation of the power control module 115 of FIG. 1 for providing voltages to blocks of memory cells. In this example, the memory structure 126 includes a set 410 of four related blocks, BLK0 to BLK3, and another set 411 of four related blocks, BLK4 to BLK7. The blocks can be in one or more planes. The row decoder 124 of FIG. 1 provides voltages to word lines and select gates of each block via pass transistors 422. The row decoder provides a control signal to pass transistors which connect the blocks to the row decoder. In one approach, the pass transistors of each set of blocks are controlled by a common control gate voltage. Thus, the pass transistors for a set of block are either all on or off at a given time. If the pass transistors are on, a voltage from the row decoder is provided to the respective control gate lines or word lines. If the pass transistors are off, the row decoder is disconnected from the respective control gate lines or word lines so that the voltage floats on the respective control gate lines or word lines.

For instance, a control gate line 412 is connected to sets of pass transistors 413, 414, 415 and 416, which in turn are connected to control gate lines of BLK4, BLK5, BLK6 and BLK7, respectively. A control gate line 417 is connected to sets of pass transistors 418, 419, 420 and 421, which in turn are connected to control gate lines of BLK0, BLK1, BLK2 and BLK3, respectively.

Typically, program or read operations are performed on one word line and one selected sub-block of the block. An erase operation may be performed on a selected block or sub-block. The row decoder can connect global control lines 402 to local control lines 403. The control lines represent conductive paths. Voltages are provided on the global control lines from a number of voltage drivers. Some of the voltage drivers may provide voltages to switches 450 which connect to the global control lines. Pass transistors 424 are controlled to pass voltages from the voltage drivers to the switches 450.

The voltage drivers can include a selected data word line (WL) driver 447, which provides a voltage on a data word line selected during an operation such as a program or read operation, or in a short circuit test. The driver 447 can provide a pre-charge voltage Vpch_n on WLn. Drivers 448 and 448a can be used for unselected data word lines, and dummy word line drivers 449 and 449a can be used to provide voltages on dummy word lines WLDD and WLDS, respectively, in FIG. 6A.

In a short circuit test, the driver 448 can be used to apply a test voltage, Vtest, to word lines subject to the test, while the driver 448a is used to provide a read pass voltage, Vread, on remaining word lines.

The voltage drivers can also include separate SGD drivers for each sub-block. For example, SGD drivers 446, 446a, 446b and 446c can be provided for SB0, SB1, SB2 and SB3, respectively, such as in FIG. 7A. In one option, an SGS driver 445 is common to the different sub-blocks in a block.

The various components, including the row decoder, may receive commands from a controller such as the state machine 112 or the controller 122 to perform the functions described herein.

The well voltage driver 430 provides a voltage Vsl to the well region 611b (FIG. 6A) in the substrate, via control lines 432. The well voltage driver 430 is one example of a source line driver, where the well region 611b is a source line, e.g., a conductive path connected to the source ends of the NAND strings. In one approach, the well region 611a is common to the blocks. A set of bit lines 442 is also shared by the blocks. A bit line voltage driver 440 provides voltages to the bit lines. In a stacked memory device such as depicted in FIGS. 4 to 8B, sets of connected memory cells may be arranged in NAND strings which extend vertically upward from the substrate. The bottom (or source end) of each NAND string is in contact with the substrate, e.g., the well region, and the top end (or drain end) of each NAND string is connected to a respective bit line, in one approach.

Figure 4:
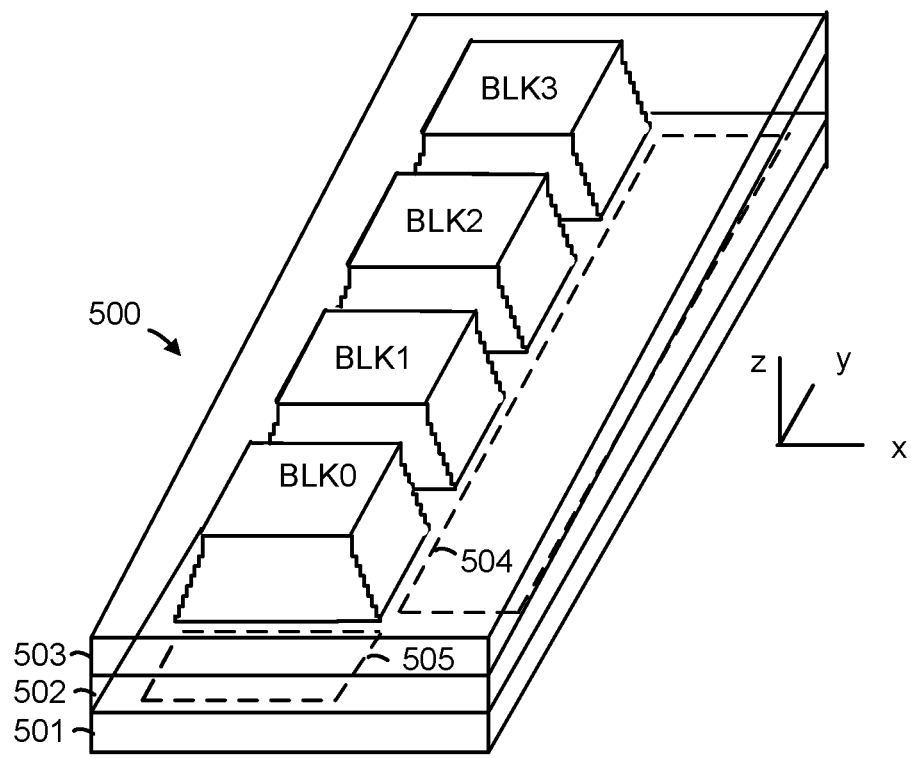
FIG. 4 is a perspective view of a memory device 500 comprising a set of blocks in an example 3D configuration of the memory structure 126 of FIG. 1.

FIG. 4 is a perspective view of a memory device 500 comprising a set of blocks in an example 3D configuration of the memory structure 126 of FIG. 1. On the substrate are example blocks BLK0-BLK3 of memory cells (storage elements) and peripheral areas with circuitry for use by the blocks. The peripheral area 504 runs along an edge of each block while the peripheral area 505 is at an end of the set of blocks. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 5:
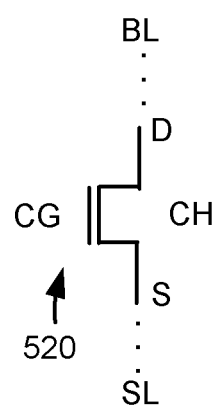
FIG. 5 depicts an example transistor 520.
Figure 6A:
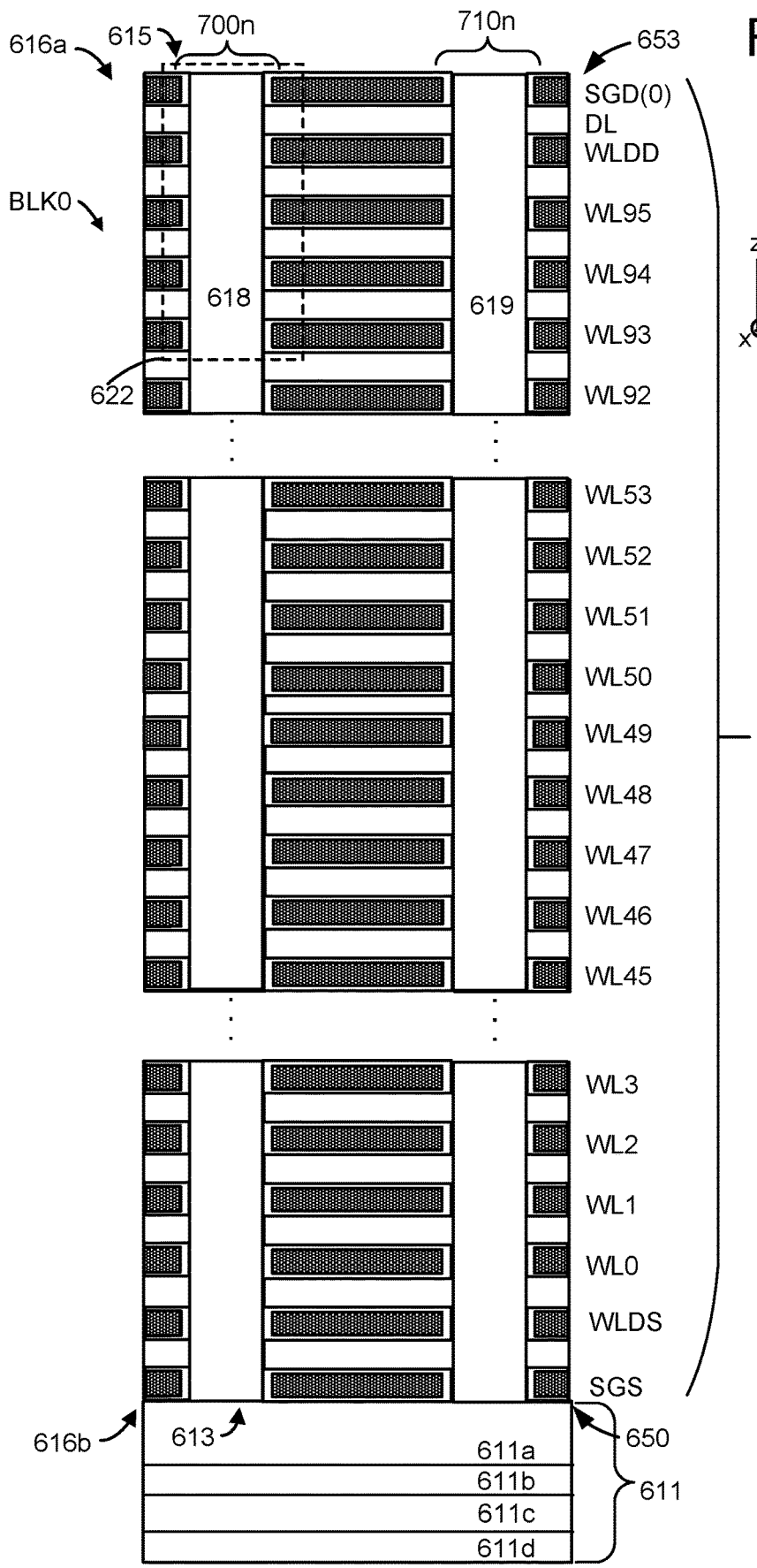
FIG. 6A depicts an example cross-sectional view of a portion of BLK0 of FIG. 4, including NAND strings 700n and 710n.

FIG. 5 depicts an example transistor 520. The transistor comprises a control gate CG, a drain D, a source S and a channel CH and may represent a memory cell or a select gate transistor, for example. The drain end of the transistor is connected to a bit line BL optionally via one or more other transistors in a NAND string, and the source end of the transistor is connected to a source line SL optionally via one or more other transistors in a NAND string, FIG. 6A depicts an example cross-sectional view of a portion of BLK0 of FIG. 4, including NAND strings 700n and 710n. In this example, the NAND strings 700n and 710n are in different sub-blocks. The block comprises a stack 610 of alternating conductive layers (word line layers) and dielectric layers. The layers may be rectangular plates having a height in the z direction, a width in the y direction, and a length in the x direction.

The stack is depicted as comprising one tier but can optionally include one or more tiers of alternating conductive and dielectric layers. A stack comprises a set of alternating conductive and dielectric layers in which a memory hole is formed in a fabrication process. The memory hole is filled with films and other materials, such as discussed in connection with FIG. 6B, to form a pillar 685.

The conductive layers comprise SGS, WLDS, WL0-WL95, WLDD and SGD(0). WLDS and WLDD are dummy word lines or conductive layers connected to dummy memory cells, which are ineligible to store user data. A dummy memory cell may have the same construction as a data memory cell but is considered by the controller to be ineligible to store any type of data including user data. One or more dummy memory cells may be provided at the drain and/or source ends of a NAND string of memory cells to provide a gradual transition in the channel voltage gradient. WL0-WL95 are data word lines connected to data memory cells, which are eligible to store user data. As an example only, the stack includes ninety-six data word lines. DL is an example dielectric layer.

A top 653 and bottom 650 of the stack are depicted. WL95 is the topmost data word line or conductive layer and WL0 is the bottommost data word line or conductive layer.

The NAND strings each comprise a memory hole 618 or 619, respectively, which is filled with materials which form memory cells adjacent to the word lines. For example, see region 622 of the stack which is shown in greater detail in FIG. 6B.

The stack is formed on a substrate 611. In one approach, a well region 611*a* (see also FIG. 3) is an n-type source diffusion layer or well in the substrate. The well region is in contact with a source end of each string of memory cells in a block. The n-type well region 611*a* in turn is formed in a p-type well region 611*b*, which in turn is formed in an n-type well region 611*c*, which in turn is formed in a p-type semiconductor substrate 611*d*, in one possible implementation. The n-type source diffusion layer may be shared by all of the blocks in a plane, in one approach, and form a source line SL which provides a voltage to a source end of each NAND string in a block.

The NAND string 700*n* has a source end 613 at a bottom 616*b* of the stack 610 and a drain end 615 at a top 616*a* of the stack. Metal-filled slits may be provided periodically across the stack as local interconnects which extend through the stack, such as to connect the source line to a line above the stack. The slits may be used during the formation of the word lines and subsequently filled with metal. Vias may be connected at one end to the drain ends of the NAND strings and at another end to a bit line.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

FIG. 6B depicts a close-up view of the region 622 of the stack of FIG. 6A. Memory cells are formed at the different levels of the stack at the intersection of a word line layer and a memory hole. An SGD transistor 716 connected to SGD (0), a dummy memory cell 715 connected to WLDD and data memory cells 712-714 connected to WL93-WL95, respectively, are depicted.

A number of layers or films can be deposited along the sidewall (SW) of the memory hole 629 and/or within each word line layer, e.g., using atomic layer deposition. For example, each pillar 685 or column which is formed by the materials within a memory hole can include a blocking oxide layer 663, a charge-trapping layer 664 or film such as silicon nitride (Si3N4) or other nitride, a tunneling layer 665 (e.g., a gate oxide), a channel 660 (e.g., comprising polysilicon), and a dielectric core 666 (e.g., comprising silicon dioxide). A word line layer can include a metal barrier 661 and a conductive metal 662 such as Tungsten as a control gate. For example, control gates 690-694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Figure 6C:
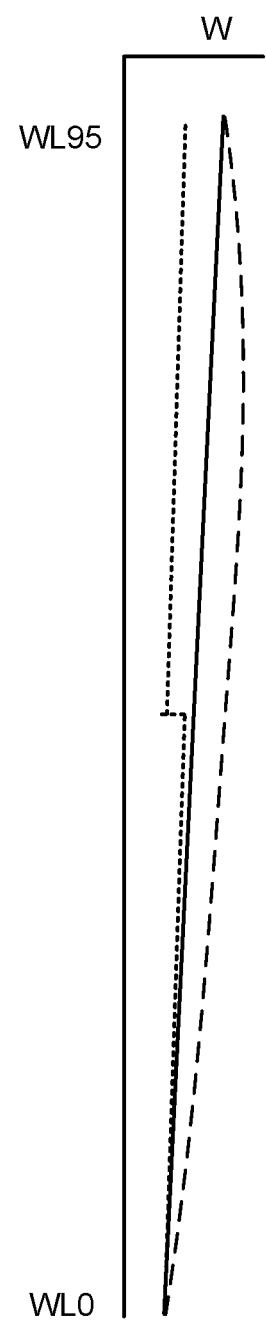
FIG. 6C depicts a plot of examples of memory hole width along the memory hole 618 in FIG. 6A.

The pillar has a width W represented by the arrow 640. The width can vary along the length of the NAND string and along the height of the stack, such as depicted in FIG. 6C.

Each NAND string or set of connected transistors comprises a channel which extends continuously from one or more source-end select gate transistors to one or more drain-end select gate transistors. For example, the channels 700*a*, 710*a*, 720*a* and 730*a* extend continuously in the NAND strings 700*n*, 710*n*, 720*n* and 730*n*, respectively, from the source end to the drain end of each NAND string.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. See FIG. 6C-6F. During an erase operation, the electrons return to the channel.

While the above example is directed to a 3D memory device with vertically extending NAND strings, the techniques provided herein are also applicable to a 2D memory device in which the NAND strings extend horizontally on a substrate. Both 2D and 3D NAND strings may have a polysilicon channel with grain boundary traps. Moreover, the techniques may be applied to memory devices with other channel materials as well.

Note that the techniques described herein for programming memory cells and detecting short circuits are compatible with various types of memory device including the 3D memory device of FIG. 4-7 and a 2D memory device.

FIG. 6C depicts a plot of memory hole width along the memory hole 618 in FIG. 6A. The vertical axis is aligned with the stack of FIG. 6A and depicts a width W, e.g., diameter, of the pillars formed by materials in the memory hole 618. In such a memory device, the memory holes which are etched through the stack have a very high aspect ratio.

For example, a depth-to-diameter ratio of about 25-30 is common. The memory holes may have a circular cross-section. Due to the etching process, the memory hole and resulting pillar width can vary along the length of the hole. Typically, the diameter becomes progressively smaller from the top to the bottom of the memory hole (solid line in FIG. 6C). That is, the memory holes are tapered, narrowing at the bottom of the stack. In some cases, a slight narrowing occurs at the top of the hole near the select gate so that the diameter becomes slight wider before becoming progressively smaller from the top to the bottom of the memory hole (long dashed line in FIG. 6C).

In another possible implementation, represented by the short dashed line, the stack is fabricated in two tiers. The bottom tier is formed first with a respective memory hole. The top tier is then formed with a respective memory hole which is aligned with the memory hole in the bottom tier. Each memory hole is tapered such that a double tapered memory hole is formed in which the width increases, then decreases and increases again, moving from the bottom of the stack to the top.

Due to the non-uniformity in the width of the memory hole and resulting pillar, the program and erase speed of the memory cells can vary based on their position along the memory hole. When the width of a portion of the memory hole is relatively small, the electric field across the tunnel oxide is relatively strong, so that the program and erase speed is relatively high for memory cells in word lines adjacent to the portion. A larger width correlates with a relatively low program and erase speed. Further, as described in connection with FIG. 11B, the short circuit test voltage, Vtest, for one or more word lines may be adjusted based on the corresponding pillar width.

Figure 7B:
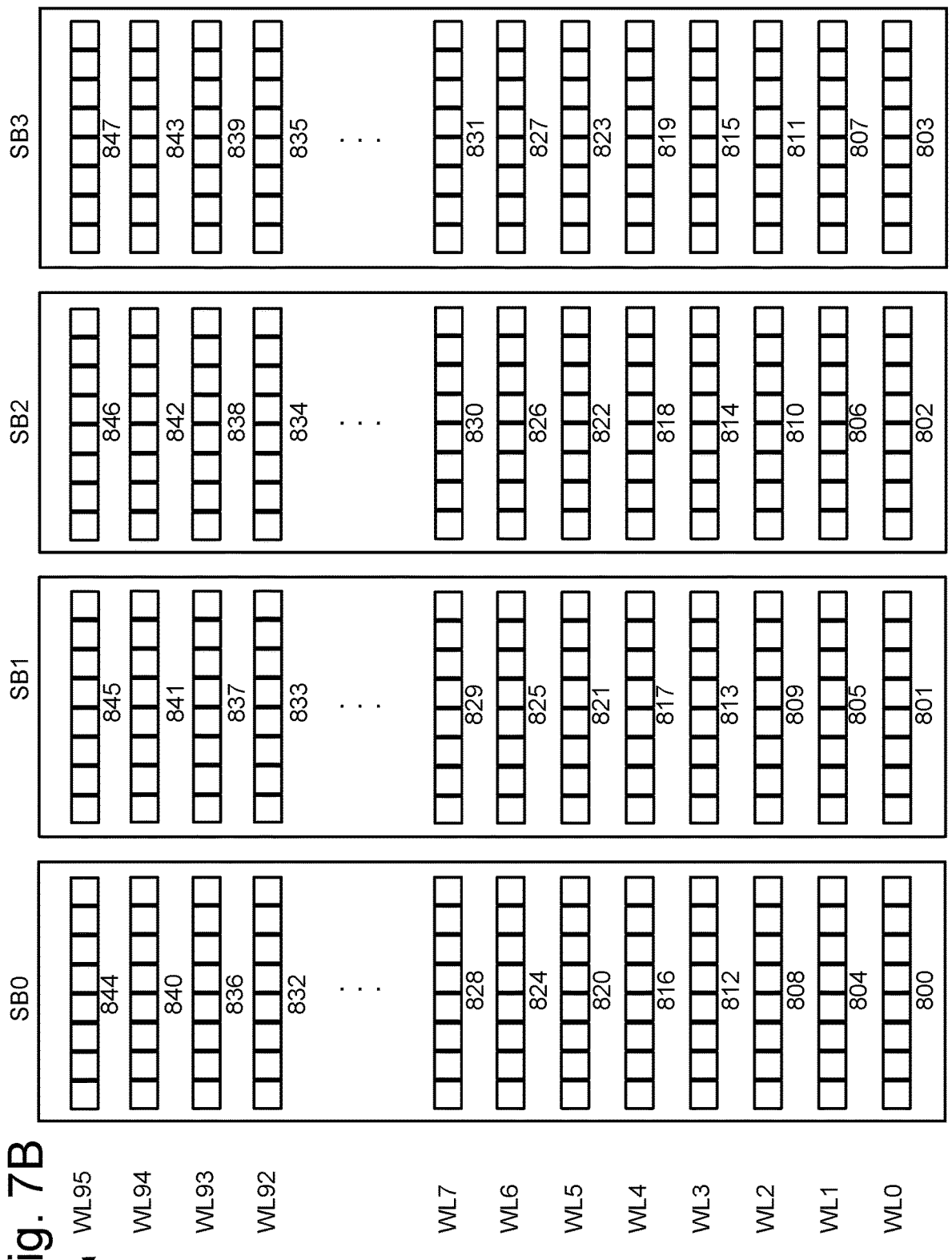
FIG. 7B depicts an example arrangement of memory cells in sub-blocks and along word lines, consistent with FIG. 7A.

FIG. 7A depicts an example view of NAND strings in the block BLK0 which is consistent with FIGS. 4 and 6A. The NAND strings are arranged in sub-blocks of the block in a 3D configuration. Each sub-block includes multiple NAND strings, where one example NAND string is depicted. For example, SB0-SB3 comprise example NAND strings 700n, 710n, 720n and 730n, respectively. The NAND strings have data word lines, dummy word lines and select gate lines consistent with FIG. 6A. Each sub-block comprises a set of NAND strings which extend in the x direction and which have a common SGD line or control gate layer. The NAND strings 700n, 710n, 720n and 730n are in sub-blocks SB0-SB3, respectively. As mentioned, programming of the block may occur based on a word line programming order and a sub-block programming order. For example, the memory cells connected to a word line in SB0 may be programmed first, followed by the memory cells connected to the word line in SB1, followed by the memory cells connected to the word line in SB2, followed by the memory cells connected to the word line in SB3. For example, in FIG. 7B, for WL2, the sets of memory cells 808-811 are programmed in turn, one set at a time. The word line programming order may start at WL0, the source-end word line and end at WL95, the drain-end word line, for example.

The NAND strings 700n, 710n, 720n and 730n have channels 700a, 710a, 720a and 730a, respectively. Additionally, NAND string 700n includes SGS transistor 701, dummy memory cell 702, data memory cells 703-714, dummy memory cell 715 and SGD transistor 716. NAND string 710n includes SGS transistor 721, dummy memory cell 722, data memory cells 723-734, dummy memory cell 735 and SGD transistor 736. NAND string 720n includes SGS transistor 741, dummy memory cell 742, data memory cells 743-754, dummy memory cell 755 and SGD transistor 756. NAND string 730n includes SGS transistor 761, dummy memory cell 762, data memory cells 763-774, dummy memory cell 775 and SGD transistor 776.

This example depicts one SGD transistor at the drain-end of each NAND string, and one SGS transistor at the source-end of each NAND string. The SGD transistors in SB0, SB1, SB2 and SB3 may be driven by separate control lines SGD(0), SGD(1), SGD(2) and SGD(3), respectively, in one approach. In another approach, multiple SGD and/or SGS transistors can be provided in a NAND string.

FIG. 7B depicts an example arrangement of memory cells in sub-blocks and along word lines, consistent with FIG. 7A. WL0-WL7 include sets of memory cells 800-803, 804-807, 808-811, 812-815, 816-819, 820-823, 824-827 and 828-831 in SB0-SB3, respectively. WL92-WL95 include sets of memory cells 832-835, 836-839, 840-843 and 844-847 in SB0-SB3, respectively. Each set is depicted as having eight memory cells but, in practice, the number of memory cells per set is much greater.

Figure 8A:
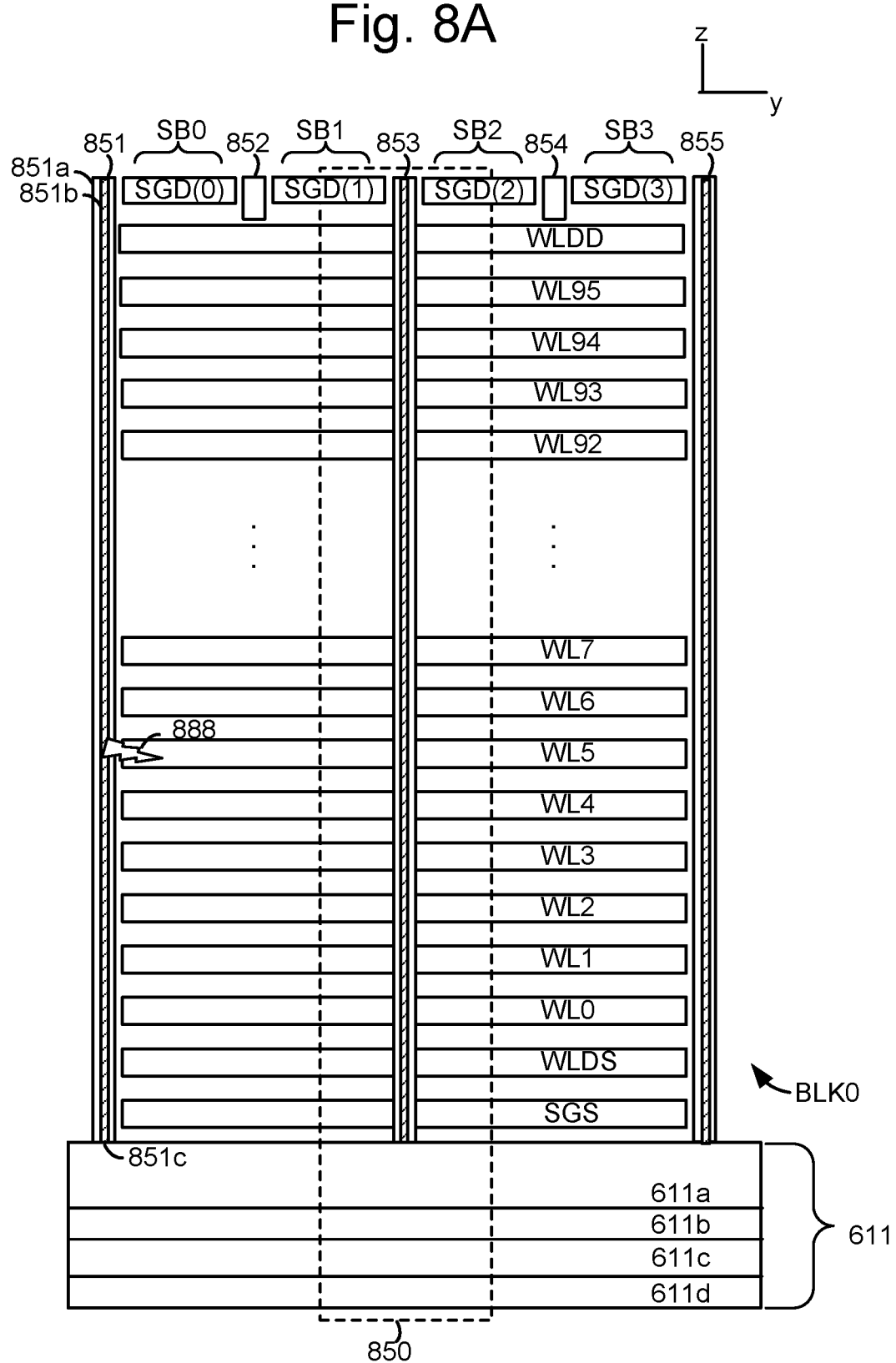
FIG. 8A depicts an example cross-sectional view of the block BLK0 consistent with FIG. 6A, including a short circuit 888 between the local interconnect 851 and WL5.

FIG. 8A depicts an example cross-sectional view of the block BLK0 consistent with FIG. 6A, including a short circuit 888 between the local interconnect 851 and WL5. The region 850 corresponds to the portion of the block in FIG. 6A. The block comprises a plurality of control gate layers spaced apart vertically and separated by dielectric layers (not depicted). The control gate layers include data word line layers WL0-WL95, dummy word line layers WLDS and WLDD, and select gate layers SGS and SGD. Each layer has the shape of a rectangular plate. Additionally, a separate SGD layer SGD(0)-SGD(3) is provided in each sub-block SB0-SB3, respectively.

The block includes local interconnects (LI) 851, 853 and 855. The LIs 851 and 855 are at opposing edges of the block and the LI 853 is in the middle of the block. The local interconnects can be provided periodically in a block, typically at the edges of a block and in an interior region. Additionally, an isolation region 852 separates the SGD(0) and SGD(1) layers, and an isolation region 854 separates the SGD(2) and SGD(3) layers.

The local interconnect 851 can comprise a conductive material 851b such as metal surrounded by insulating material 851a to prevent conduction with the metal of the adjacent word lines. The local interconnect is connected at its bottom 851c to the well region 611a (FIG. 6A) of the substrate. The substrate is one example of a source line, e.g., a conductive path connected to the source ends of the NAND strings. In other memory device architectures, the source line can be separate from the substrate. For example, in the CMOS under array or circuit under array architecture, the source line is no longer connected to substrate.

Each dummy word line layer and data word line layer extends across all sub-blocks of a block. The local interconnect 853 only partially interrupts a word line layer. Each SGS layer may also extend across all sub-blocks of a block, in one approach.

Various types of word line short circuits can occur over the lifetime of a memory device. For example, a short circuit path can develop between a word line and the memory hole or source line. The short circuit 888 is between WL5 and the source line since the source line is connected to the local interconnect 851. The short circuit is formed through the insulating material 851a. When a word line short circuit occurs, a voltage applied to the word line is pulled down to the level of the source line, for instance, so that a program voltage, read voltage or read pass voltage cannot be applied at the desired level to the short circuited word line. As a result, when the programmed memory cells of a short circuited word line are read, their Vth will be higher than the effective word line voltage and they will be in a non-conductive state.

Short circuits can be caused by various factors, including contaminants such as dust which are embedded in the memory device during the fabrication process. During the lifetime of a memory device, the location of a short circuit in a stack tends to be random. Although, the stress of the program pulse applied to a word line in a program operation tends to correlate with the formation of a short circuit in that word line. The techniques described herein include performing a short circuit test for one or more word lines after they are programmed In some cases, even though the programming of a single word line can cause a short circuit, the test is performed for multiple word lines after they are programmed, to reduce a time penalty. Generally, the timing of the short circuit test can be tied to the capacity of the volatile storage for the write data. The short circuit test can be delayed as long as possible, but not so long that the write data will be overwritten from the storage before a short circuit is detected for memory cells programmed by that write data.

Figure 8B:
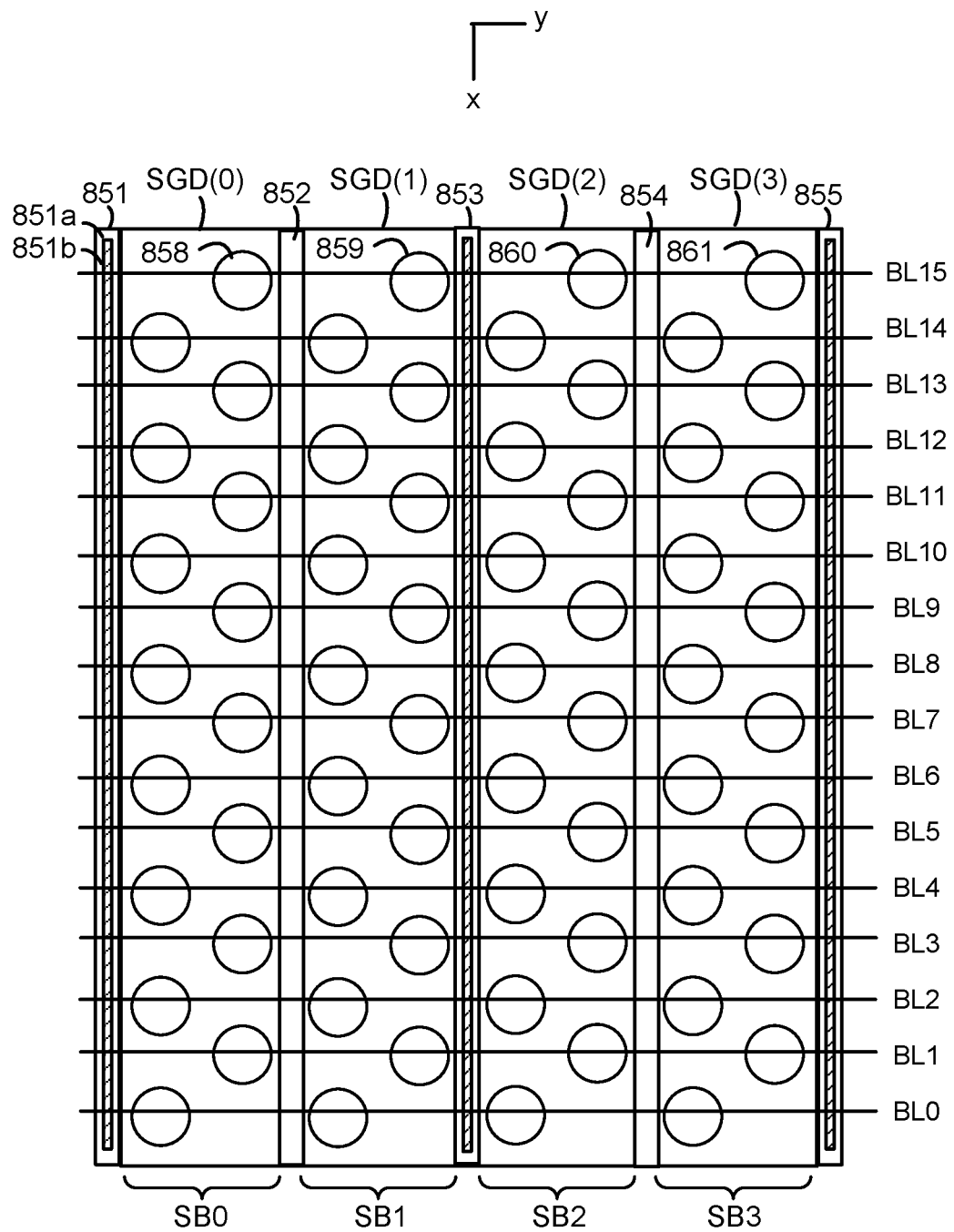
FIG. 8B depicts an example top view of the block BLK0 of FIG. 8A, including a set of bit lines BL0-BL15 connected to NAND strings in a set of sub-blocks SB0-SB3.

FIG. 8B depicts an example top view of the block BLK0 of FIG. 8A, including a set of bit lines BL0-BL15 connected to NAND strings in a set of sub-blocks SB0-SB3. The SGD layers of SGD(0)-SGD(3) are depicted, along with the local interconnects 851, 853 and 855 and the isolation regions 852 and 854. Each SGD layer has a number of memory holes or NAND strings passing through it. Each circle represents the cross-section of a memory hole or string. A number of bit lines BL0 to BL15 extend above the memory holes, across the top of the stack. Each bit line is connected to one NAND string in each sub-block. For example, BL15 is connected to NAND strings 858-861 in SB0-SB3, respectively. The NAND strings are arranged in rows which extend in the x-direction, and adjacent rows are staggered to improve the memory hole density. Eight rows of NAND strings, with eight NAND string per row, are depicted as a simplified example. In practice, the sub-blocks are elongated in the x direction and contain thousands of NAND strings.

As described further below, e.g., in connection with FIG. 10C, step 1022, a short circuit test can involve sensing currents in the set of bit lines from one or more sub-blocks of NAND strings concurrently. By concurrently sensing multiple sub-blocks, the time penalty of the short circuit test is reduced. In some cases, to reduce power consumption, the sensing can occur for a portion of the sub-blocks, which is fewer than all of the sub-blocks.

FIG. 9A depicts example threshold voltage (Vth) distributions of a set of memory cells storing one bit per cell, and evaluation of an upper tail of the Vth distribution. The vertical axis depicts a number of memory cells on a logarithmic scale, and the horizontal axis depicts a Vth of the memory cells on a linear scale. At a start of a program operation, the memory cells are all initially in the erased (Er) state, as represented by the Vth distribution 900. After a single program pulse is applied with an initial magnitude of Vpgm_init, the memory cells assigned to the programmed state are represented by the Vth distribution 901. The position of the Vth distribution is based on the program speed of the memory cells, which in turn can be affected by lot-to-lot, wafer-to-wafer and die-to-die process variations. Electron trapping and detrapping in the charge trapping layers, which occur as program-erase cycles accumulate in a block, is also a factor.

A read operation can be performed to evaluate the extent of the upper tail of the Vth distribution, as a measure of the program speed. For example, the region 901a represents the Vth values which exceed Vr. The associated memory cells will therefore be sensed as being in a non-conductive state. A count can be obtained of these associated memory cells for use in the table of FIG. 9C, to adjust Vpgm_init. The adjusted value, Vpgm_adj, can then be used in subsequent program operations. As mentioned in connection with FIG. 1, a counting circuit 121 can be used for counting a number of memory cells whose Vth exceeds a read voltage Vr, as depicted by the region 901a in FIG. 9A.

In an erase operation, the data memory cells transition from the Vth distributions of the programmed data state to the erased state. The erase operation includes an erase phase in which the memory cells are biased for erasing followed by an erase-verify test. The erase-verify test can use an erase-verify voltage, VvEr, which is applied to the word lines.

After the memory cells are programmed, the data can be read back in a read operation. A read operation can involve applying a read voltage Vrl to the word line while sensing circuitry determines whether cells connected to the word line are in a conductive (turned on) or non-conductive (turned off) state. If a cell is in a non-conductive state, the Vth of the memory cell exceeds the read voltage. The read voltage is set at a level which is between the Vth of the erase state and the Vth of the programmed state, for SLC programming During the read operation, the voltages of the unselected word lines are increased to a read pass level (Vread) or turn on level which is high enough to place the unselected memory cells in a strongly conductive state, to avoid interfering with the sensing of the selected memory cells. A word line which is being programmed or read is referred to as a selected word line, WLn.

FIG. 9B depicts example program pulses 910 and 911 used in a program operation. In single pulse SLC programming, a single pulse is applied to a word line, in one approach. For memory cells assigned to the erased state, their associated bit line voltage is set at a high level to prevent programming. For memory cells assigned to the programmed state, their associated bit line voltage is set at a low level such as 0 V to allow programming. The program pulses 910 and 911 have magnitudes of Vpgm_init and Vpgm_adj, respectively, and are used to obtain the Vth distributions 901 and 901b, respectively, in FIGS. 9A and 9E, respectively. Vpgm_init and Vpgm_adj may be in the range of 18-22 V, for example.

FIG. 9C depicts an example of the table 116 of FIG. 1, showing an adjustment ΔVpgm to the program pulse 910 of FIG. 9B as a function of a count of memory cells having a Vth>Vr, consistent with FIG. 9A. The values N1-N4 may represent different threshold counts or portions of the programmed memory cells, e.g., 3, 6, 12 and 20%, respectively, for example, where N1<N2<N3<N4. When the count N is greater than N4, ΔVpgm=0 V, indicating that Vpgm_init is optimal. In this case, there is no significant under programming and therefore no need to increase Vpgm. When the count is between N1 and N2, N2 and N3, N3 and N4 or greater than N4, ΔVpgm=0.2 V, 0.4 V, 0.6 V and 0.8 V, respectively, for example. A lower count indicates a greater degree of under-programming, such that a larger increase should be made to Vpgm_init. Vpgm_init can be set based on testing, such that under-programming is more likely than over-programming. An adjusted magnitude, Vpgm_adj=Vpgm_int+ΔVpgm, can be determined using the table.

When there is under-programming of the WL0 memory cells, an additional program pulse can be applied with the magnitude Vpgm_adj, without performing a verify test, to shift the Vth distribution slightly higher to a desired level, such as depicted in FIG. 9E.

The counting circuit 121 can be used to determine the count such as by counting a number of 0's in the data latches.

When a block is programmed, the count can be obtained based on programming of memory cells in one or more sub-blocks of the initial word line WL0. The adjusted or optimized Vpgm can then be used in programming remaining memory cells of WL0, if any, and memory cells in the remaining word lines, in one approach. In another approach, an Vpgm_adj can be determined for different groups of word lines in a block, such as depicted in FIG. 9D.

FIG. 9D depicts example groups of memory cells which can each have an optimized program pulse magnitude, consistent with FIGS. 9A and 9C. Optimizing the Vpgm for each group can be useful to account for program speed variations between the different groups due to variations in the memory hole width along the height of the stack, such as discussed in connection with FIG. 6C. The groups can have an equal number of word lines, as in this example, or an unequal number. In this example, groups 1140-1143 include word lines WL0-WL23, WL24-WL47, WL48-WL71 and WL72-WL95.

For group 1140, Vpgm can be optimized based on programming of WL0 and the optimized Vpgm used in programming WL1-WL23. For group 1141, Vpgm can be optimized based on programming of WL24 and the optimized Vpgm used in programming WL24-WL47. For group 1142, Vpgm can be optimized based on programming of WL48 and the optimized Vpgm used in programming WL49-WL71. For group 1142, Vpgm can be optimized based on programming of WL72 and the optimized Vpgm used in programming WL73-WL95.

FIG. 9E depicts an example Vth distribution 901b which is obtained by programming memory cells in the Vth distribution 901 of FIG. 9A with an additional program pulse of magnitude Vpgm_adj, consistent with FIG. 9B. The rightward arrow shows the Vth distribution is shifted slightly higher, to an optimum level, due to the additional program pulse. With this approach, the memory cells which are used to adjust Vpgm_init can be programmed to an optimum level so that accuracy is not reduced and read errors are avoided.

Similarly, there is no need to erase the block and re-program these memory cells. Instead, the optimum Vpgm is determined during the programming of the WL0 memory cells in the course of the programming of a block.

Figure 10C:
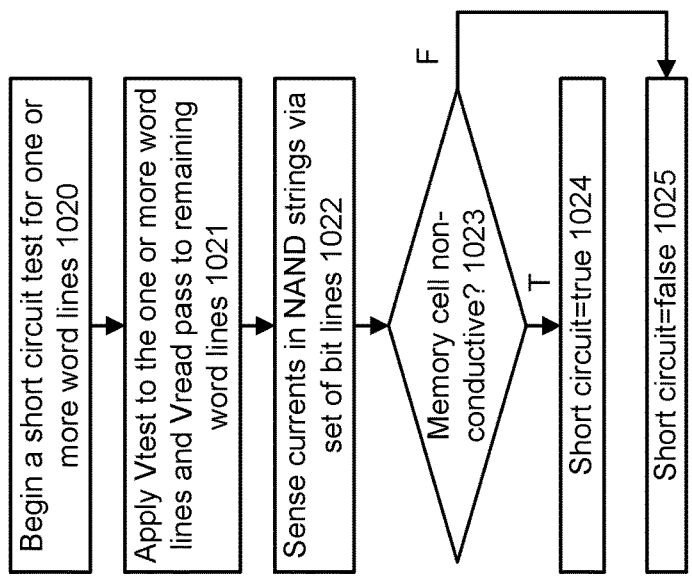
FIG. 10C depicts an example process for performing a short circuit test for one or more word lines, in an implementation of step 1012 of FIG. 10B.
Figure 10B:
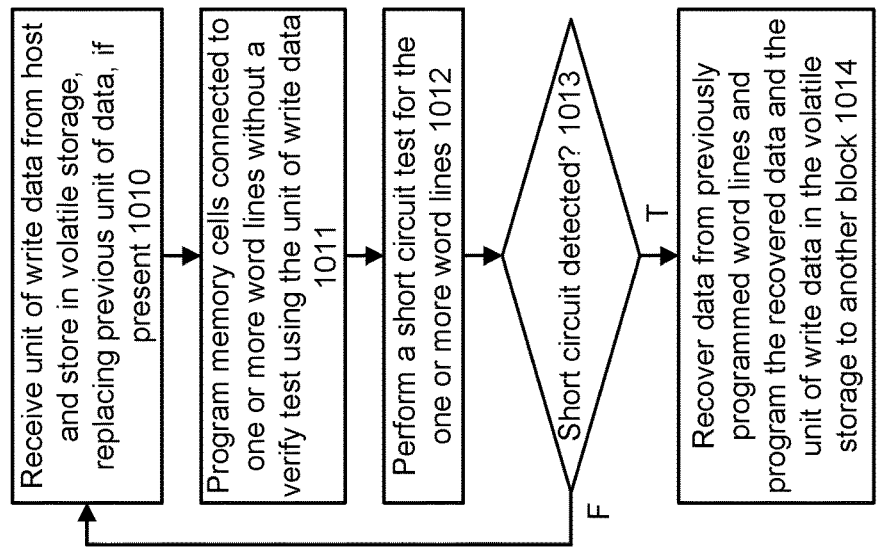
FIG. 10B depicts an example process for programming memory cells followed by performing a short circuit test for one or more word lines.
Figure 10A:
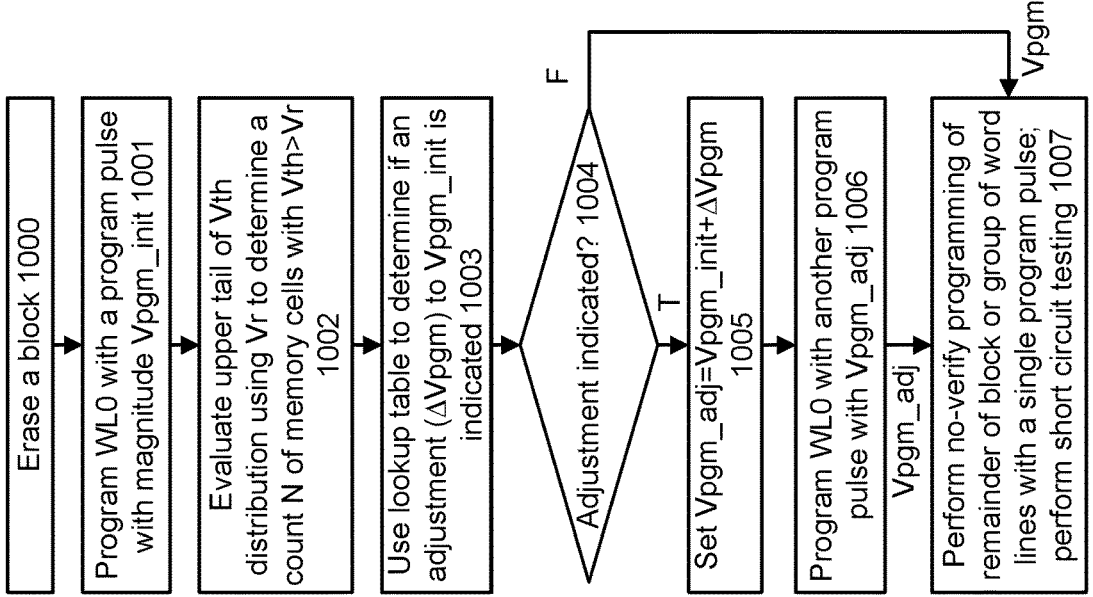
FIG. 10A depicts an example process for determining an optimum Vpgm for programming, consistent with FIG. 9A-9D.

FIG. 10A depicts an example process for determining an optimum Vpgm for programming, consistent with FIG. 9A-9D. Step 1000 involves erasing a block to provide all of the memory cells in the erased state. Step 1001 includes programming WL0 with a program pulse with magnitude Vpgm_init. Step 1002 includes evaluating an upper tail of the Vth distribution of the programmed state using Vr to determine a count N of memory cells with Vth>Vr. These are memory cells which are sensed as being in a non-conductive state when Vr is applied to the word line. Step 1003 includes using a lookup table to determine if an adjustment (ΔVpgm) to Vpgm_init is indicated, such as depicted in FIG. 9C.

A decision step 1004 determines if an adjustment is indicated. If no adjustment is indicated, step 1007 performs no-verify programming of a remainder of the block, or a remainder of a group of word lines, using a single program pulse with magnitude Vpgm_init. Short circuit testing is also performed. Optionally, the no-verify programming can use a predetermined number of one or more program pulses. If decision step 1004 is true, step 1005 sets Vpgm_adj=Vpgm_init+ΔVpgm. Step 1006 involves programming the memory cells of WL0 with an additional program pulse with magnitude Vpgm_adj, such as depicted in FIG. 9E. Step 1007 is subsequently reached, where the no-verify programming uses Vpgm_adj.

In an example implementation, an apparatus comprises a block of memory cells, where the memory cells are connected to a set of word lines and include memory cells connected to an initial word line of the block, and a control circuit. The control circuit is configured to apply a first single program pulse having an initial magnitude (Vpgm_int) to an initial word line (step 1001), obtain a count of number of the memory cells connected to the initial word line having a threshold voltage greater than a read voltage (step 1002), determine an adjusted magnitude (Vpgm_adj) which is greater than the initial magnitude based on the count, and apply a second single program pulse having the adjusted magnitude to the initial word line without performing a verify test, to complete programming of the memory cells connected to an initial word line (step 1006).

FIG. 10B depicts an example process for programming memory cells followed by performing a short circuit test for one or more word lines. The process can be performed using the optimized Vpgm which is obtained from the process of FIG. 10A, in one approach. For example, the optimized Vpgm can be determined while programming WL0 using FIG. 10A, after which the process of FIG. 10B is performed for the remaining word lines. The process of FIG. 10B enables a one-pulse, zero-verify fast SLC programming in a NAND memory device to reduce programming time while detecting abnormal programming. Further time savings can be obtained by performing a short circuit test concurrently for multiple sub-blocks and/or multiple word lines. The short circuit test can detect a short circuit for a relatively large number of memory cells concurrently, e.g., the memory cells which are programmed by a unit of write data, in contrast to verify tests which are performed more frequently, and on a relatively smaller number of memory cells. The short circuit test is a substitute for the verify test, and ensures that programming has been successfully completed. The techniques can be implemented on-chip or through firmware in the controller, for example.

Step 1010 includes receiving a unit of write data from a host and storing it in a storage 122c, replacing a previous unit of write data, if present in the storage. Step 1011 includes programming the memory cells connected to one or more word lines without performing a verify test using the unit of write data. Generally, the memory cells which are programmed by the unit of write data are connected to an integer number M word lines, where M is at least one. Step 1011 can include transferring the write data from the storage to the latches of the memory cells being programmed while retaining a copy of the write data in the storage. The programming can involve a single program pulse, for example. Step 1012 includes performing a short circuit test for the one or more word lines, such as discussed in connection with FIG. 10C. A decision step 1013 determines if a short circuit is detected in step 1012. If the decision step 1013 is false, there is no short circuit and step 1010 is repeated. If the decision step 1013 is true, there is a short circuit and step 1014 involves recovering data from the previously programmed word lines and programming the recovered data and the unit of write data in the storage to another block.

The detected short circuit will typically be limited to the one or more word lines being programmed so that data in previously programmed word lines may potentially be recovered. Some recovery techniques involving performing an erase operation on the one or more word lines. The block can be marked as being bad so that it is no longer used.

FIG. 10C depicts an example process for performing a short circuit test for one or more word lines, in an implementation of step 1012 of FIG. 10B. Step 1020 begins a short circuit test for one or more word lines. Step 1021 applies Vtest to the one or more word lines and Vread pass to remaining word lines. Vtest can be higher than Vread pass by about 2-4 V or 20% or more, for example. For example, Vread pass can be 6-8 V and Vtest can be 8-12 V. A goal of applying a relatively high Vtest is to stress the one or more word lines to identify the presence of a short circuit. In some cases, a soft short circuit is present which may not be detectable unless stressed with a relatively high voltage. However, Vtest should not be too high, e.g., as high as Vpgm_init or Vpgm_adj, or it can cause a program disturb on the one or more word lines.

Vread pass should be sufficiently higher than the Vth of the programmed data state, which might be 3-5 V, for example, to provide the associate memory cells in a strongly conductive state. For example, Vread pass may be at least 3 V higher than the expected upper tail Vth, e.g., 5 V, of the programmed memory cells.

Step 1022 includes sensing currents in the NAND strings via a set of bit lines. These are the NAND strings of the memory cells of the one or more word lines which were programmed. As discussed in FIG. 12A-12E, for example, the NAND strings being sensed can be in one or more sub-blocks of a block. The sense circuit discussed in connection with FIG. 2 can be used for sensing. When multiple sub-blocks are sensed, the current sensed on a bit line is the current in one NAND string, or more than one NAND strings. For example, in FIG. 8A, if all four sub-blocks are sensed concurrently, each bit line will carry current from four NAND strings. If SB0-SB2 (but not SB3) are sensed concurrently, each even-numbered bit line carries current in a NAND string from SB0-SB2 but not from SB3.

A decision step 1023 determines if one or more memory cells in the sensed NAND strings are non-conductive. As mentioned, a short circuit can result in the voltage applied to the one or more word lines being pulled down to the source line voltage, e.g., 0-0.5 V, for example, so that the memory cells connected to the one or more word lines are sensed as being in a non-conductive state. In one approach, the presence of one non-conductive memory cell is sufficient to conclude that there is a short circuit. Generally, the presence of a specified number of one or more non-conductive memory cells indicates that there is a short circuit.

If decision step 1023 is true, step 1024 indicates that short circuit=true, i.e., there is a short circuit in the one or more word lines being tested. If decision step 1023 is false, step 1025 indicates that short circuit=false, i.e., there is no short circuit in the one or more word lines being tested. The process then returns to step 1013 of FIG. 10B.

As mentioned, Vtest should be set to stress the one or more word lines being tested at an appropriate level. The appropriate level can vary based on factors such as the position of the one or more word lines in the stack and the number of sub-blocks encompassed by the memory cells being programmed, that is, the number of sub-blocks being sensed. The position can indicate the number of previously programmed word lines.

Figure 11A:
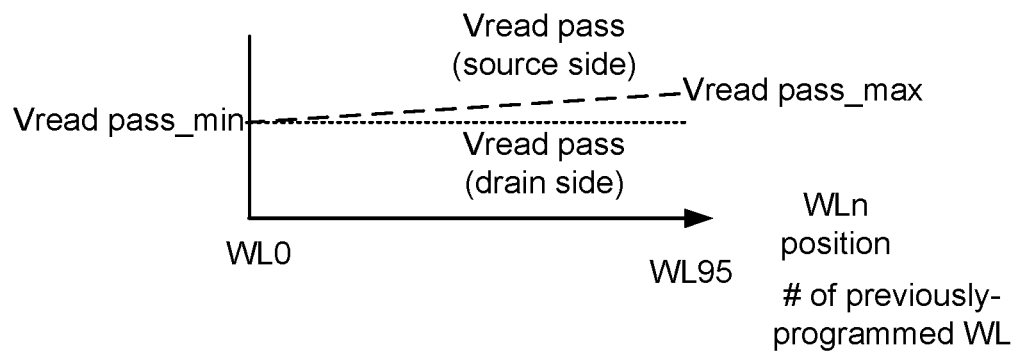
FIG. 11A depicts an example plot of Vread pass versus WLn position, for use in optimizing the value of Vread pass used in step 1021 of the process of FIG. 10C.

FIG. 11A depicts an example plot of Vread pass versus WLn position, for use in optimizing the value of Vread pass used in step 1021 of the process of FIG. 10C. The WLn position denotes the position in a stack or block of the one or more word lines being tested. Generally, when a word line programming order begins at the source side of the block and proceeds to the drain side, the source side word lines of the one or more word lines will be programmed while the drain side word lines of the one or more word lines will be in the erased state. For example, if WLn=WL60 is the word line being tested for a short circuit, WL0-WL59 are the source side word lines and WL61-WL95 are the drain side word lines. The source side word lines are between WLn and the source end of the block or NAND strings and the drain side word lines are between WLn and the drain end of the block or NAND strings.

Although some source side memory cells (connected to the the source side word lines) will remain in the erased state after programming, there will be a significant number of source side memory cells with the elevated Vth of the programmed data state, such as 3-5 V. These programmed memory cells can have a greater resistance in their channels and thereby reduce the amount of current flowing in a NAND string during sensing, potentially resulting in an unwarranted determination that the memory cells of the one or more word lines are in a non-conductive state. Further, the reduction in current is greater when there are more source side word lines, e.g., when the one or more word lines being tested are closer to the drain side of the block and there is a source-to-drain word line programming order.

To address this issue, a higher Vread pass can be applied to the source side word lines of the one or more word lines being tested compared to the Vread pass applied to the drain side word lines of the one or more word lines being tested. The dashed line shows that Vread pass for the source side word lines can increase from a minimum value of Vread pass_min when WLn=WL0 to a maximum of Vread pass_max when WL=WL95. By increasing Vread pass for the source side word lines as the number of programmed memory cells increases in a NAND string, e.g., as the number of previously-programmed word lines increases, these programmed memory cells can have a fixed resistance in their channels so that the amount of current flowing in a NAND string during sensing does not change based on WLn. The dotted line shows that Vread pass for the drain side word lines can be fixed at Vread pass_min.

As an example, Vread pass_min=7 V and Vread pass_max=8 V. Another option is to apply one Vread pass for the source side word lines and another, lower Vread pass for the drain side word lines, regardless of the position of the one or more word lines being tested. For example, if WLn=WL60 is the word line being tested for a short circuit, Vread pass=8 V for the source side word lines and Vread pass=7 V for the drain side word lines.

Figure 11B:
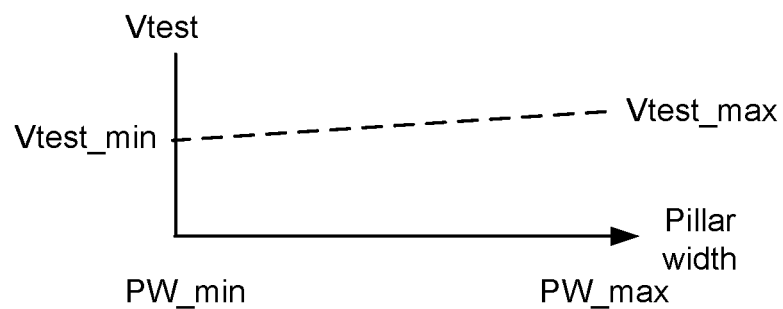
FIG. 11B depicts an example plot of Vtest versus pillar width, for use in optimizing the value of Vtest used in step 1021 of the process of FIG. 10C.
Figure 11C:
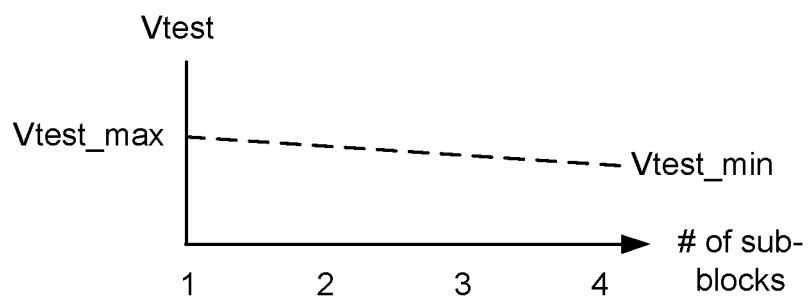
FIG. 11C depicts an example plot of Vtest versus number of sub-blocks being sensed, for use in optimizing the value of Vtest used in step 1021 of the process of FIG. 10C.

FIGS. 11B and 11C involve optimizing the value of Vtest which is used in the word line short circuit test of FIG. 10C.

FIG. 11B depicts an example plot of Vtest versus pillar width, for use in optimizing the value of Vtest used in step 1021 of the process of FIG. 10C. As mentioned in connection with FIG. 6C, the pillar width can vary as a function of a highest in the stack and a position along the length of the NAND strings. When the pillar is wider, the electric field across a memory cell is smaller for a given word line voltage. Accordingly, the current through the channel of a memory cell will be smaller for a given word line voltage, potentially causing an unwarranted short circuit indication. To provide a compensation which avoids this situation, Vtest can be set to a relatively high level when the pillar width (PW) is relatively wide. For example, the pillar width may vary from a minimum of PW_min to a maximum of PW_max. As depicted by the dashed line, Vtest may vary from a minimum of Vtest_min, e.g., 10 V to a maximum of Vtest_max, e.g., 12 V as PW varies from PW_min to PW_max.

In one approach, an initial word line of a block is used to determine the optimum Vpgm, and another word line of the block is programmed using the optimum Vpgm. The memory cells of the block are arranged in NAND strings, and the NAND strings comprise respective pillars having a width which varies along a height in the block. During a short circuit test involving the another word line, the test voltage is an increasing function of a width of the respective pillars adjacent to the another word line.

FIG. 11C depicts an example plot of Vtest versus number of sub-blocks being sensed, for use in optimizing the value of Vtest used in step 1021 of the process of FIG. 10C. The current which is sensed in a group of NAND string can vary based on the number of sub-blocks being sensed in a short circuit test. When a larger number of sub-blocks (and the corresponding number of NAND strings) are concurrently sensed, with given word line voltages, the current will be greater. This is because there are relatively more NAND strings contributing a current on the respective bit lines, e.g., one NAND string per sub-block, due to the sharing of bit lines among sub-blocks as depicted in FIG. 8B. Similarly, when a smaller number of sub-blocks (and the corresponding number of NAND strings) are concurrently sensed, with given word line voltages, the current will be smaller. This situation could potentially result in an unwarranted short circuit indication.

To provide a compensation which avoids this situation, Vtest can be set to a relatively high level when the number of sub-blocks being sensed is relatively small. For example, the pillar width may vary from a maximum of Vtest_max to a minimum of Vtest_min as the number of sub-blocks being sensed increases from one to four.

In the tables of FIG. 12A-12E, word line and select gate lines are listed on the left hand column. For the SGD, the voltage can be set independently in each sub-block to provide the SGD transistors of the NAND strings in an on (conductive) state, or an off (non-conductive) state. For the word lines, a single voltage is provided on a word line which extends in the different sub-blocks. Vread denotes the read pass voltage. The NAND strings of a sub-block which is sensed in a short circuit test can be connected to respective bit lines which are shared among the sub-blocks, such as in FIG. 8B, by providing their respective SGD transistors in a conductive state. That is, a voltage on the SGD line is set to be greater than the Vth of the SGD transistors. Similarly, the NAND strings of one or more remaining sub-blocks, which are not sensed in a short circuit test, can be disconnected from respective bit lines which are shared among the sub-blocks by providing their respective select gate (SGD) transistors in a non-conductive state. That is, a voltage on the SGD line is set to be less than the Vth of the SGD transistors.

As mentioned, the sensing during a short circuit test determines if one or more memory cells in the sensed NAND strings are non-conductive. It is not necessary to sense NAND strings which have not been programmed because such sensing would typically indicate that all cells are in a conductive state. The memory cells in the NAND strings which have not been programmed will be in the erased state and may have a Vth of −1 V, for example. When Vtest is applied to the one or more word lines being tested, these cell will be in a conductive state even if there is a short circuit which pulls down Vtest to the source line voltage of 0-0.5 V. Additionally, power can be saved during the sensing process by disconnecting the NAND strings which have not been programmed from the sense circuits. The examples of FIGS. 12D and 12E disconnect the NAND strings of SB3 and SB2, respectively, from the sense circuits.

As an option, the sensing process could include NAND strings of one or more sub-block which have not been programmed.

FIG. 12A depicts example word line and select gate voltages for use in step 1021 of the process of FIG. 10C, where the short circuit test is for one word line WLn and all four sub-blocks SB0-SB3. Vtest is applied to the one word line which is being tested for a short circuit, WLn. Vread is applied to the remaining word lines. Since all four sub-blocks are involved in the test, SGD is on for SB0-SB3. SGS is also on for SB0-SB3.

In FIG. 12A, the unit of write data stored in the volatile storage 122c is for programming the memory cells connected to one word line, WLn. As an example, in FIG. 7B, if WLn=WL2, the unit of write data is for the sets of memory cells 808-811. This is an example of a first group of memory cells which encompasses a full word line.

The unit of write data could be one page of data, where one page of data is stored per word line in four sub-blocks, one quarter page per sub-block. In another approach, the unit of write data could be two pages, where a first page of data is stored in SB0 and SB1 and a second page is stored in SB2 and SB3. In another approach, the unit of write data could be four pages, where one page of data is stored in each of SB0-SB3.

After the memory cells connected to WLn are programmed and a short circuit test indicates there is no short circuit for WLn, a next unit of write data for WLn+1 can replace the current unit of write data in the volatile storage. As an example, in FIG. 7B, the next unit of write data is for WL3 and the sets of memory cells 812-815. This is an example of a next group of memory cells.

FIG. 12B depicts example word line and select gate voltages for use in step 1021 of the process of FIG. 10C, where the short circuit test is for three word lines WLn to WLn+2 and all four sub-blocks SB0-SB3. Vtest is applied to the three word lines which are being tested. Vread is applied to the remaining word lines. Since all four sub-blocks are involved in the test, SGD is on for SB0-SB3. SGS is also on for SB0-SB3.

In FIG. 12B, the unit of write data stored in the volatile storage 122c is for programming the memory cells connected to three word lines, WLn to WLn+2. The unit of write data could be three pages, where first through third pages of data are stored in WLn to WLn+2, respectively, one page per word line. In another approach, the unit of write data could be six pages, where a first page of data is stored in WLn in SB0 and SB1, a second page of data is stored in WLn in SB2 and SB3, a third page of data is stored in WLn+1 in SB0 and SB1, a fourth page of data is stored in WLn+1 in SB2 and SB3, a fifth page of data is stored in WLn+2 in SB0 and SB1, and a sixth page of data is stored in WLn+2 in SB2 and SB3, with two pages per word line. In another approach, the unit of write data could be twelve pages, where first through fourth pages are stored in WLn in SB0-SB3, respectively, fifth through eighth pages are stored in WLn+1 in SB0-SB3, respectively, and ninth through twelfth pages are stored in WLn+2 in SB0-SB3, respectively, with four pages per word line. As an example, in FIG. 7B, if WLn to WLn+2 are WL2-WL4, respectively, the unit of write data is for the sets of memory cells 808-819. This is an example of a first group of memory cells which encompasses three full word lines.

After the memory cells connected to WLn through WLn+2 are programmed and a short circuit test indicates there is no short circuit, a next unit of write data for WLn+3 through WLn+5 can replace the current unit of write data in the volatile storage. As an example, in FIG. 7B, the next unit of write data is for the sets of memory cells 820-831 in WL5-WL7. This is an example of a next group of memory cells.

FIG. 12C depicts example word line and select gate voltages for use in step 1021 of the process of FIG. 10C, where the short circuit test is for one word line WLn and all four sub-blocks SB0-SB3, and another word line WLn+1 and two of four sub-blocks (SB0 and SB1). Even though the memory cells of WLn+1 in SB2 and SB3 were not programmed, the short circuit test will test currents in NAND strings in SB0-SB3 since the memory cells of WLn in SB0-SB3 are programmed. Vtest is applied to the two word lines which are being tested for a short circuit, WLn and WLn+1. Vread is applied to the remaining word lines. Since all four sub-blocks are involved in the test, SGD is on for SB0-SB3. SGS is also on for SB0-SB3.

In FIG. 12C, the unit of write data stored in the volatile storage 122c is for programming the memory cells connected to all of WLn and a first half of WLn+1. The unit of write data could be three pages, where a first page of data is stored in WLn in SB0 and SB1, a second page of data is stored in WLn in SB2 and SB3, and a third page of data is stored in WLn+1 in SB0 and SB1, with two sub-blocks per page. In another approach, the unit of write data could be six pages, where first through fourth pages are stored in WLn in SB0-SB3, respectively, and fifth and sixth pages are stored in WLn+1 in SB0 and SB1, respectively, with one sub-block per page. As an example, in FIG. 7B, if WLn and WLn+1 are WL2 and WL3, respectively, the unit of write data is for the sets of memory cells 808-813. This is an example of a first group of memory cells which encompasses one full word line (e.g., WLn) and a subset (e.g., the first half, comprising SB0 and SB1) of another word line (e.g., WLn+1).

After the memory cells connected to all of WLn and the first half of WLn+1 are programmed and a short circuit test indicates there is no short circuit for WLn and WLn+1, a next unit of write data for the second half of WLn+1 (in SB2 and SB3) and all of WLn+2 can replace the current unit of write data in the volatile storage. As an example, in FIG. 7B, the next unit of write data is for the sets of memory cells 814-819 in WL3 and WL4. This is an example of a next group of memory cells.

FIG. 12D depicts example word line and select gate voltages for use in step 1021 of the process of FIG. 10C, where the short circuit test is for one word line WLn and three of four sub-blocks SB0-SB2. The short circuit test does not involve the memory cells of WLn in SB3, so the SGD transistors in SB3 are set to the off state. The SGS transistors in SB3 can also be set to the off state if the SGS transistors can be independently controlled in each sub-block. If the SGS transistors in the sub-blocks are connected and cannot be independently controlled in each sub-block, the SGS transistor can be set to the on state in SB3 also.

Vtest is applied to WLn to test the memory cells of SB0-SB2. The currents from NAND strings in these blocks are concurrently sensed. On a given word line, currents will be sensed from one NAND string in each of SB0-SB2. In contrast, the currents in the NAND strings in SB3 are not sensed. Vread is applied to the remaining word lines.

In FIG. 12D, the unit of write data stored in the volatile storage 122c is for programming the memory cells connected to WLn in SB0-SB2 but not SB3. The unit of write data could be three pages, where first through third pages are stored in WLn and SB0-SB3, respectively. As an example, in FIG. 7B, if WLn=WL2, a first unit of write data is for the sets of memory cells 808-810. This is an example of a first group of memory cells which encompasses a subset, e.g., SB0-SB2, of a word line, where the subset refers to a strict subset or a portion of the word line which is less than the full word line. After the memory cells connected to WLn in SB0-SB2 are programmed and a short circuit test indicates there is no short circuit for WLn, a next (second) unit of write data for WLn in SB3 and WLn+1 in SB0 and SB1 can replace the current (first) unit of write data in the volatile storage. As an example, in FIG. 7B, the second unit of write data is for the sets of memory cells 811-813 in WL2 and WL3. This is an example of a next group of memory cells.

Subsequently, as depicted in FIG. 12E, after the memory cells connected to WLn in SB3 and WLn+1 in SB0 and SB1 are programmed, a short circuit test is performed for WLn and WLn+1. If this test indicates there is no short circuit for WLn and WLn+1, a next (third) unit of write data for WLn+1 in SB2 and SB3 and WLn+2 in SB0 can replace the current (second) unit of write data in the volatile storage. As an example, in FIG. 7B, the third unit of write data is for the sets of memory cells 814-816 in WL3 and WL4.

FIG. 12E depicts example word line and select gate voltages for use in step 1021 of the process of FIG. 10C, and following the configuration of FIG. 12D, where the short circuit test is for one word line WLn and one of four sub-blocks, SB3, and a next word line WLn+1 and two of four sub-blocks SB0 and SB1. After the memory cells connected to WLn in SB0-SB2 are programmed, as discussed in connection with FIG. 12D, the memory cells connected to WLn in SB3 and to WLn+1 in SB0 and SB1 are programmed. The programming thus encompasses two word lines and three sub-blocks. As an example, in FIG. 7B, the second unit of write data is for the sets of memory cells 811-813 in WL2 and WL3.

The short circuit test does not involve the memory cells of SB2, so the SGD transistors in SB2 are set to the off state. The SGS transistors in SB2 can also be set to the off state if the SGS transistors can be independently controlled in each sub-block. If the SGS transistors in the sub-blocks are connected and cannot be independently controlled in each sub-block, the SGS transistor can be set to the on state in SB3 also.

Vtest is applied to WLn to test the memory cells of SB3, and to WLn+1 to test the memory cells of SB0 and SB1. The currents from the NAND strings in these sub-blocks are concurrently sensed. In contrast, the currents in the NAND strings in SB2 are not sensed. Vread is applied to the remaining word lines.

Accordingly, it can be see that in one implementation, an apparatus comprises: a set of word lines; a plurality of memory cells, the memory cells are connected to the word lines; a control circuit connected to the memory cells; and a volatile storage connected to the control circuit, the volatile storage configured to store successive units of write data, one unit at a time, including a unit of write data for a first group of memory cells of the plurality of memory cells, the first group of memory cells is connected to one or more word lines of the set of word lines; the control circuit is configured to program the first group of memory cells using the unit of write data without performing a verify test, subsequently test the one or more word lines for a short circuit, and decide whether to replace the unit of write data for the first group of memory cells with a unit of write data for a next group of memory cells based on a result of the test.

In another implementation, a method comprises: storing write data for a first group of memory cells of a block in a volatile storage, the first group of memory cells is connected to multiple word lines of a set of word lines; programming the first group of memory cells using the write data without performing a verify test; in response to completion of the programming, concurrently testing the multiple word lines for a short circuit; and in response to the testing indicating that there is no short circuit, replacing the write data for the first group of memory cells with write data for a next group of memory cells of the block and programming the next group of memory cells of the block.

In another implementation, an apparatus comprises: a set of word lines; a block of memory cells, the memory cells are connected to the a set of word lines and include memory cells connected to an initial word line of the block; and a control circuit connected to the memory cells, the control circuit is configured to apply a first single program pulse having an initial magnitude to the initial word line, obtain a count of number of the memory cells connected to the initial word line having a threshold voltage greater than a read voltage, determine an adjusted magnitude which is greater than the initial magnitude based on the count, and apply a second single program pulse having the adjusted magnitude to the initial word line without performing a verify test, to complete programming of the memory cells connected to an initial word line.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
   a set of word lines;
   a plurality of memory cells, the memory cells are connected to the word lines;
   a control circuit connected to the memory cells; and
   a volatile storage connected to the control circuit, the volatile storage configured to store successive units of write data, one unit at a time, including a unit of write data for a first group of memory cells of the plurality of memory cells, the first group of memory cells is connected to one or more word lines of the set of word lines; and
   the control circuit is configured to program the first group of memory cells using the unit of write data without performing a verify test, subsequently test the one or more word lines for a short circuit, and decide whether to replace the unit of write data for the first group of memory cells with a unit of write data for a next group of memory cells based on a result of the test.

2. The apparatus of claim 1, wherein:
   the control circuit, to test for the short circuit, is configured to apply a test voltage to the one or more word lines and read pass voltages to remaining word lines of the set of word lines while determining whether there is a non-conductive memory cell among the first group of memory cells;
   the test voltage is greater than the read pass voltage; and
   the read pass voltages comprise a read pass voltage on a source side of the one or more word lines which is greater than a read pass voltage on a drain side of the one or more word lines.

3. The apparatus of claim 1, wherein:
   the first group of memory cells is connected to multiple word lines of the set of word lines;
   the control circuit, to test for the short circuit, is configured to apply a test voltage to the multiple word lines and a read pass voltage to remaining word lines of the set of word lines while determining whether there is a non-conductive memory cell among the first group of memory cells; and
   the test voltage is greater than the read pass voltage.

4. The apparatus of claim 1, wherein:
   the first group of memory cells is connected to a single word line of the set of word lines;
   the control circuit, to test for the short circuit, is configured to apply a test voltage to the one word line and a read pass voltage to remaining word lines of the set of word lines while determining whether there is a non-conductive memory cell among the first group of memory cells; and
   the test voltage is greater than the read pass voltage.

5. The apparatus of claim 1, wherein:
   the control circuit is configured to replace the unit of write data for the first group of memory cells with the unit of write data for the next group of memory cells, and to program the next group of memory cells, in response to the test for the short circuit indicating there is no short circuit.

6. The apparatus of claim 1, wherein:
   the first group of memory cells encompasses a subset of one word line; and
   the control circuit is configured to test for the short circuit in response to completing programming of memory cells in the first group of memory cells encompassing the subset of the one word line.

7. The apparatus of claim 1, wherein:
   the first group of memory cells encompasses a full word line of the one or more word lines and a subset of another word line of the one or more word lines; and
   the control circuit is configured to program memory cells in the first group of memory cells encompassing the full word line before programming memory cells in the first group of memory encompassing the subset of the another word line, and to test for the short circuit in the full word line and the another word line in response to completing programming of the memory cells encompassing the subset of the another word line.

8. The apparatus of claim 1, wherein:
   the plurality of memory cells are arranged in a block, the block comprises a set of sub-blocks;
   a set of bit lines is shared among the set of sub-blocks;
   the first group of memory cells is connected to a single word line of the set of word lines, and is arranged in NAND strings in multiple sub-blocks of the set of sub-blocks; and
   the control circuit, to test for the short circuit, is configured to concurrently:
   connect the NAND strings in the multiple sub-blocks to the set of bit lines by providing respective select gate transistors of the NAND strings in the multiple sub-blocks in a conductive state;

apply a test voltage to the one or more word lines and a read pass voltage to remaining word lines of the set of word lines; and sense currents on the set of bit lines to determine whether there is a non-conductive memory cell among the first group of memory cells.

9. The apparatus of claim 8, wherein:

the control circuit, to test for the short circuit, is configured to disconnect NAND strings in one or more remaining sub-blocks of the set of sub-blocks from the set of bit lines by providing respective select gate transistors of the NAND strings in the one or more remaining sub-blocks of the set of sub-blocks in a non-conductive state.

10. The apparatus of claim 8, wherein:

the test voltage is greater when a number of sub-blocks in the multiple sub-blocks is lower.

11. The apparatus of claim 1, wherein:

to program the first group of memory cells using the unit of write data without performing a verify test, the control circuit is configured to apply a single program pulse having an initial magnitude to the first group of memory cells; and the control circuit is configured to evaluate an upper tail of a threshold voltage distribution of the first group of memory cells after the programming of the first group of memory cells, determine an adjusted magnitude which is greater than the initial magnitude in response to the evaluating, and apply an additional program pulse having the adjusted magnitude to the first group of memory cells without performing a verify test.

12. A method, comprising:

storing write data for a first group of memory cells of a block in a volatile storage, the first group of memory cells is connected to multiple word lines of a set of word lines;

programming the first group of memory cells using the write data without performing a verify test;

in response to completion of the programming, concurrently testing the multiple word lines for a short circuit; and in response to the testing indicating that there is no short circuit, replacing the write data for the first group of memory cells with write data for a next group of memory cells of the block and programming the next group of memory cells of the block.

13. The method of claim 12, wherein:

the testing comprises applying a test voltage to the multiple word lines and a read pass voltage to remaining word lines of the set of word lines while determining whether there is a non-conductive memory cell among the first group of memory cells.

14. The method of claim 13, wherein:

the test voltage is greater than the read pass voltage.

15. The method of claim 12, wherein:

the block comprises a set of sub-blocks;

the first group of memory cells are arranged in NAND strings in multiple sub-blocks of the set of sub-blocks;

a set of bit lines is shared among the set of sub-blocks; and the testing comprises concurrently:

connecting the NAND strings in the multiple sub-blocks to the set of bit lines;

applying a test voltage to the multiple word lines and a read pass voltage to remaining word lines of the set of word lines; and sensing currents on the set of bit lines to determine whether there is a non-conductive memory cell among the first group of memory cells.

16. An apparatus, comprising:

a set of word lines;

a block of memory cells, the memory cells are connected to the set of word lines and include memory cells connected to an initial word line of the block; and a control circuit connected to the memory cells, the control circuit is configured to apply a first single program pulse having an initial magnitude to the initial word line, obtain a count of number of the memory cells connected to the initial word line having a threshold voltage greater than a read voltage, determine an adjusted magnitude which is greater than the initial magnitude based on the count, and apply a second single program pulse having the adjusted magnitude to the initial word line without performing a verify test, to complete programming of the memory cells connected to an initial word line.

17. The apparatus of claim 16, wherein:

the control circuit is configured to apply a single program pulse having the adjusted magnitude to another word line in the block without performing a verify test, and to perform a short circuit test of the another word line to determine whether programming of memory cells connected to the another word lines is successfully completed.

18. The apparatus of claim 17, wherein:

to perform the short circuit test, the control circuit is configured to apply a test voltage to the another word line and a read pass voltage to remaining word lines of the set of word lines while determining whether there is a non-conductive memory cell among memory cells connected to the another word line; and the test voltage is greater than the read pass voltage.

19. The apparatus of claim 18, wherein:

the memory cells of the block are arranged in NAND strings;

the NAND strings comprise respective pillars having a width which varies along a height in the block; and the test voltage is an increasing function of a width of the respective pillars adjacent to the another word line.

20. The apparatus of claim 18, wherein:

the test voltage is greater than the read pass voltage.

* * * * *